US011503189B2

(12) United States Patent
Yui et al.

(10) Patent No.: US 11,503,189 B2
(45) Date of Patent: Nov. 15, 2022

(54) CAMERA AND DISPLAY THEREOF

(71) Applicant: GoPro, Inc., San Mateo, CA (US)

(72) Inventors: Stephen Yui, Pacifica, CA (US); Clark Weber, Mill Valley, CA (US); John George Muhlenkamp, IV, Brisbane, CA (US); Huy Phuong Nguyen, Alpine, UT (US); Grant Adam McCauley, San Mateo, CA (US)

(73) Assignee: GoPro, Inc., San Mateo, CA (US)

( * ) Notice: Subject to any disclaimer, the term of this patent is extended or adjusted under 35 U.S.C. 154(b) by 17 days.

(21) Appl. No.: 17/279,381

(22) PCT Filed: Oct. 3, 2019

(86) PCT No.: PCT/US2019/054410
§ 371 (c)(1),
(2) Date: Mar. 24, 2021

(87) PCT Pub. No.: WO2020/072723
PCT Pub. Date: Apr. 9, 2020

(65) Prior Publication Data
US 2021/0392245 A1 Dec. 16, 2021

Related U.S. Application Data

(60) Provisional application No. 62/786,061, filed on Dec. 28, 2018, provisional application No. 62/741,292, filed on Oct. 4, 2018.

(51) Int. Cl.
*H04N 5/225* (2006.01)
*H01L 27/15* (2006.01)

(52) U.S. Cl.
CPC ......... *H04N 5/2252* (2013.01); *H01L 27/156* (2013.01); *H04N 5/22525* (2018.08)

(58) Field of Classification Search
CPC ............. H04N 5/2252; H04N 5/22525; H04N 9/3138; H01L 27/156; H01L 27/3267;
(Continued)

(56) References Cited

U.S. PATENT DOCUMENTS 6,243,660 B1 * 6/2001 Hsu ..................... G01C 17/30
33/319
2002/0113866 A1 * 8/2002 Taniguchi ............ H04N 13/324
348/51
(Continued)

FOREIGN PATENT DOCUMENTS

CN 108333824 A * 7/2018

OTHER PUBLICATIONS

International Search Report Issued in Application No. PCT/US2019/054410, dated Jan. 9, 2020, 9 pages.
(Continued)

*Primary Examiner* — Sinh Tran
*Assistant Examiner* — Zhenzhen Wu
(74) *Attorney, Agent, or Firm* — Young Basile Hanlon & MacFarlane, P.C.

(57) ABSTRACT

A camera includes a lens, an image sensor, and a display. The lens and the image sensor are configured to capture images. The display may include an array of lights that are selectively illuminable to display the graphics. The lights may be arranged in a grid with each of the lights forming a pixel of the display. The display is hidden from view when not illuminated and displays graphics when illuminated. The camera may include a body that hides the display from view when not illuminated and permits light from the display to pass therethrough when illuminated. The body may include an elastomeric, light-permeable outer layer through which light from the display passes. The body may have a first side having the lens and on which the display displays the
(Continued)

graphics. The camera may include a second display on a second side of the body facing opposite the first side.

19 Claims, 13 Drawing Sheets

(58) Field of Classification Search
CPC . H01L 27/3286; H01L 51/50; H01L 2227/32; H03J 1/047
See application file for complete search history.

(56) References Cited

U.S. PATENT DOCUMENTS

| | | |
|---|---|---|
| 2005/0141063 A1 | 6/2005 | Nishino |
| 2008/0004012 A1* | 1/2008 | Polzin .................. G06F 1/1698 455/435.1 |
| 2010/0014319 A1* | 1/2010 | Oversluizen ............ H04N 5/72 362/307 |
| 2011/0194009 A1* | 8/2011 | Park .................... H04N 5/2252 348/333.01 |
| 2013/0321686 A1 | 12/2013 | Tan |
| 2015/0326766 A1 | 11/2015 | Czepowicz |
| 2019/0035317 A1* | 1/2019 | Rohena ................. G08B 21/18 |
| 2019/0335164 A1* | 10/2019 | Engelen .............. H04N 21/431 |
| 2021/0375982 A1* | 12/2021 | Wu ...................... H01L 27/156 |

OTHER PUBLICATIONS

Jim Martine, Go pro hero 7, release date, price, specs. Tech Advisor, Sep. 20, 2018, pp. 1-3.
International Preliminary Report on Patentability for App. No. PCT/US2019/054410, dated Apr. 15, 2021, 7 pages.

* cited by examiner

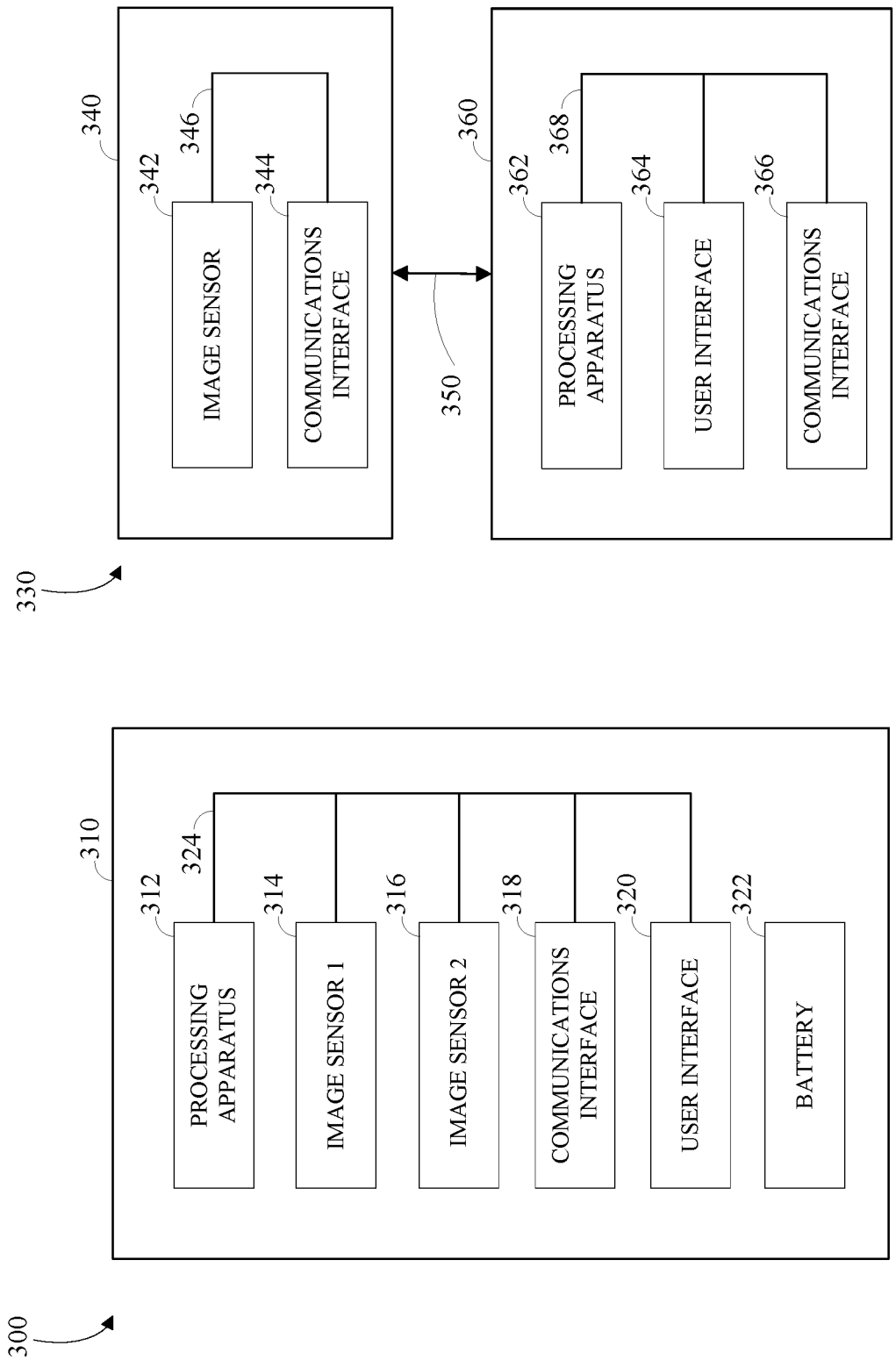

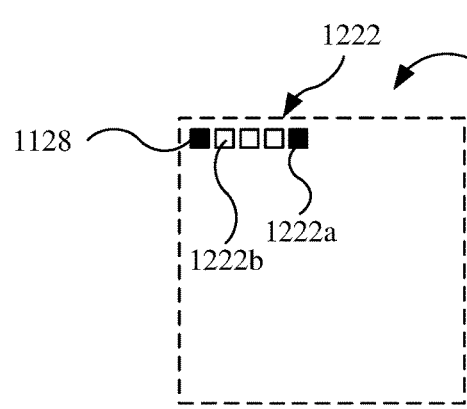
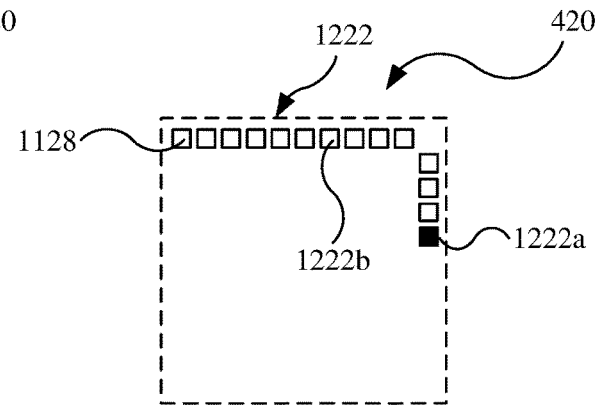
FIG. 12A  FIG. 12B
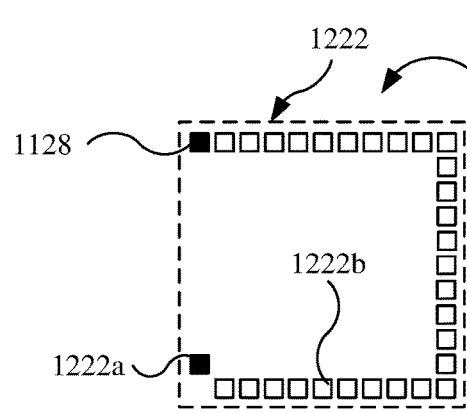
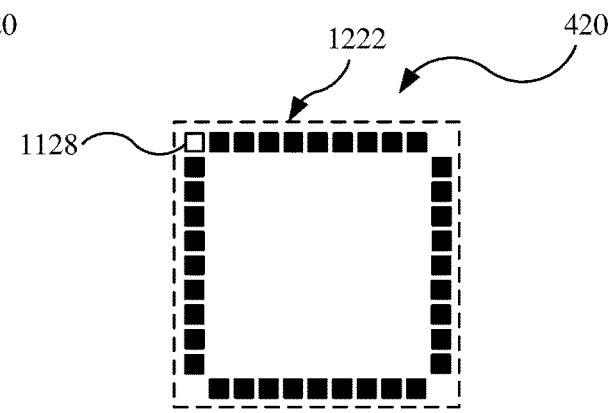
FIG. 12C  FIG. 12D
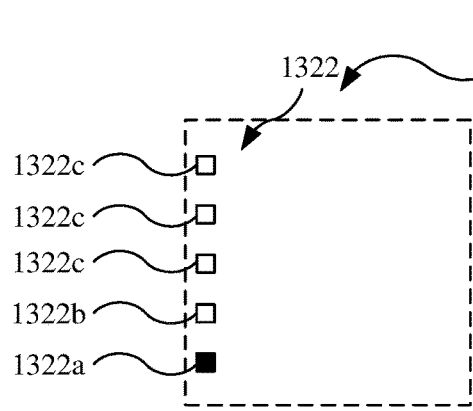
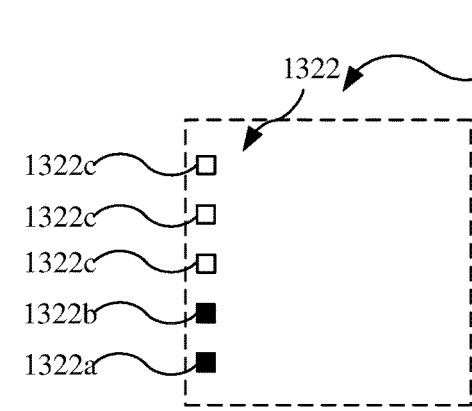
FIG. 13A  FIG. 13B

CAMERA AND DISPLAY THEREOF

CROSS-REFERENCE TO RELATED APPLICATION(S)

This application is a national stage entry of International Application No. PCT/US2019/054410, filed Oct. 3, 2019, and claims priority to and the benefit of, and U.S. Provisional Application No. 62/786,061, filed Dec. 28, 2018, and U.S. Provisional Application No. 62/741,292, filed Oct. 4, 2018, the entire disclosures of which are incorporated by reference herein.

TECHNICAL FIELD

This disclosure relates to cameras and, in particular, cameras having displays.

BACKGROUND

Cameras, especially digital cameras, include displays that may function as a viewfinder (e.g., displaying live images captured by an image sensor thereof), provide information, and/or function as an input device for receiving inputs from users. Such displays are typically provided s a liquid crystal display (LCD) panel, which are always visible, even when not operating, and are on a rear of the camera body opposite a lens capturing the images.

SUMMARY

Disclosed herein are implementations of cameras and displays thereof. In one implementation, a camera includes a lens, an image sensor, and a display. The lens and the image sensor are cooperatively configured to capture images. The display is hidden from view when not illuminated and displays graphics when illuminated. The camera may include a body that hides the display from view when not illuminated and permits light from the display to pass therethrough when illuminated to display the graphics. The body may include an outer layer comprising an elastomeric material through which the light from the display passes to display the graphics. The body may have a first side to which the lens is coupled and on which the display displays the graphics. The camera may further include a second display that is coupled to a second side of the body facing opposite the first side. The display may include an array of lights that are selectively illuminable to display the graphics. The lights may be arranged in a grid with each of the lights forming a pixel of the display.

In one implementation, a camera includes a body, a lens coupled to the first side of the body, an image sensor, a first display on a first side of the body, and a second display on a second side of the body. The second side of the body faces opposite the first side. The first side of the body includes an inner layer formed of a rigid plastic and an outer layer coupled to the inner layer and formed of an elastomeric material. The inner layer includes a grid of apertures covered by the outer layer. The lens is coupled to the first side of the body, and the image sensor is contained within the body. The lens and the image sensor are cooperatively configured to capture images. The first display includes a grid of lights that are contained within the body and selectively emit light through the grid of apertures and the elastomeric material. The first display has a first pixel density of 40 pixels per inch (PPI) or lower, and the first display has a first area. The second display faces opposite the first display. The second display is a display panel having a second pixel density of 160 PPI or greater, and has a second area that is greater than twice the first area. The grid of lights is hidden from view by the elastomeric material when not emitting light.

In one implementation, a camera includes a body having a first side and a second side facing opposite the first side. The first side of the body includes an inner layer formed of a rigid plastic and an outer layer coupled to the inner layer and formed of a light-permeable material. The inner layer has apertures covered by the outer layer. The camera includes a lens coupled to the first side of the body and an image sensor contained within the body. The lens and the image sensor are cooperatively configured to capture images. The camera includes a first display on the first side of the body, and the first display includes lights that are contained within the body and selectively emit light through the apertures and the light-permeable material. The first display has a first pixel density at or below 40 pixels per inch (PPI). The camera includes a second display on the second side of the body and facing opposite the first display. The second display is a display panel having a second pixel density at or above 160 PPI. The lights are hidden from view by the light-permeable material when not emitting light.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

FIGS. 3A-B are block diagrams of examples of image capture systems.

FIG. 12A is a front view of the display of the camera showing another time indicator and the recording indicator at a first time.

FIG. 12B is a front view of the display of the camera showing the time indicator of FIG. 9A and the recording indicator at a second time after the first time.

FIG. 12C is a front view of the display of the camera showing the time indicator of FIG. 9A and the recording indicator at a third time after the second time.

FIG. 12D is a front view of the display of the camera showing the time indicator of FIG. 9A and the recording indicator at a fourth time after the third time.

FIG. 13A is a front view of the display of the camera showing a charging indicator at a first time.

FIG. 13B is a front view of the display of the camera showing the charging indicator at a second time.

DETAILED DESCRIPTION

Disclosed here are embodiments of cameras and displays therefor. The embodiments of displays disclosed herein are hidden from view when not in use and/or may be provided on a front of the camera, which also includes a lens for capturing images. The display may be a secondary display having a relatively low resolution and/or a relatively low pixel density relative to a primary display screen. The primary display screen may be provided on a rear side of the camera, opposite the secondary display and the lens. For example, the display may be a light array comprising individual lights that are selectively illuminated to display graphics through a body (e.g., a front housing portion) of the camera. These and other aspects of the camera and the display are discussed in further detail below.

Figure 1A:
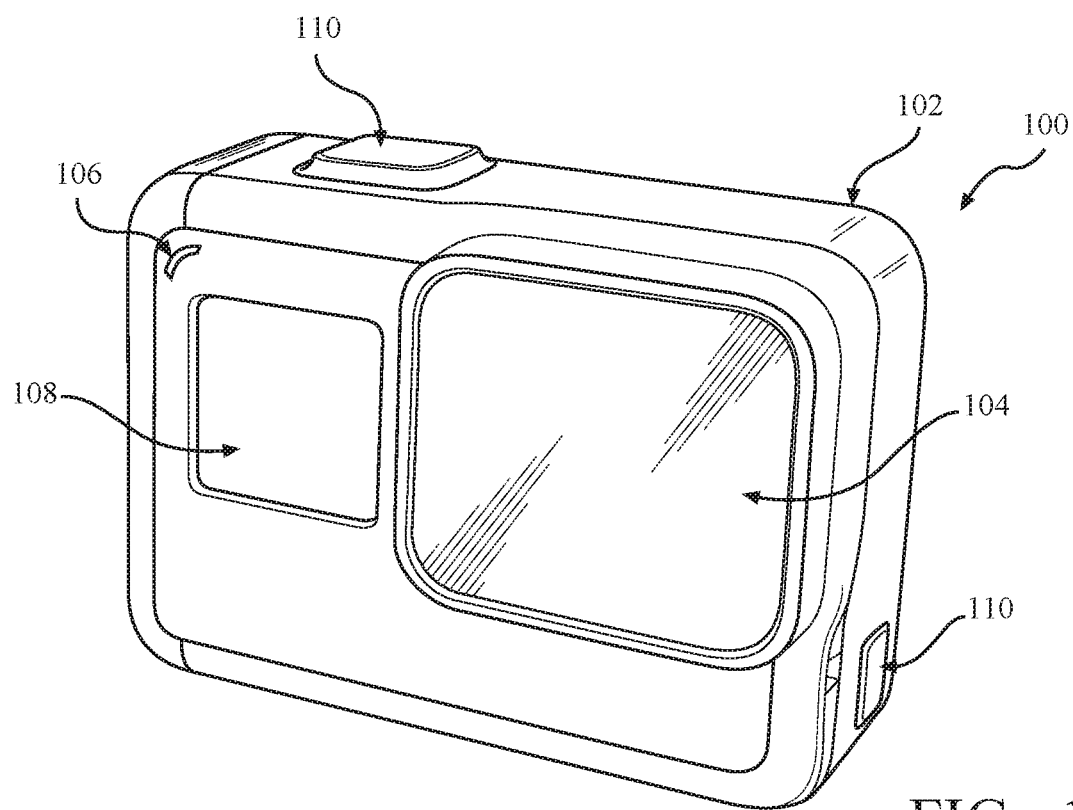
FIGS. 1A-C are perspective views of an example of an image capture device.
Figure 1B:
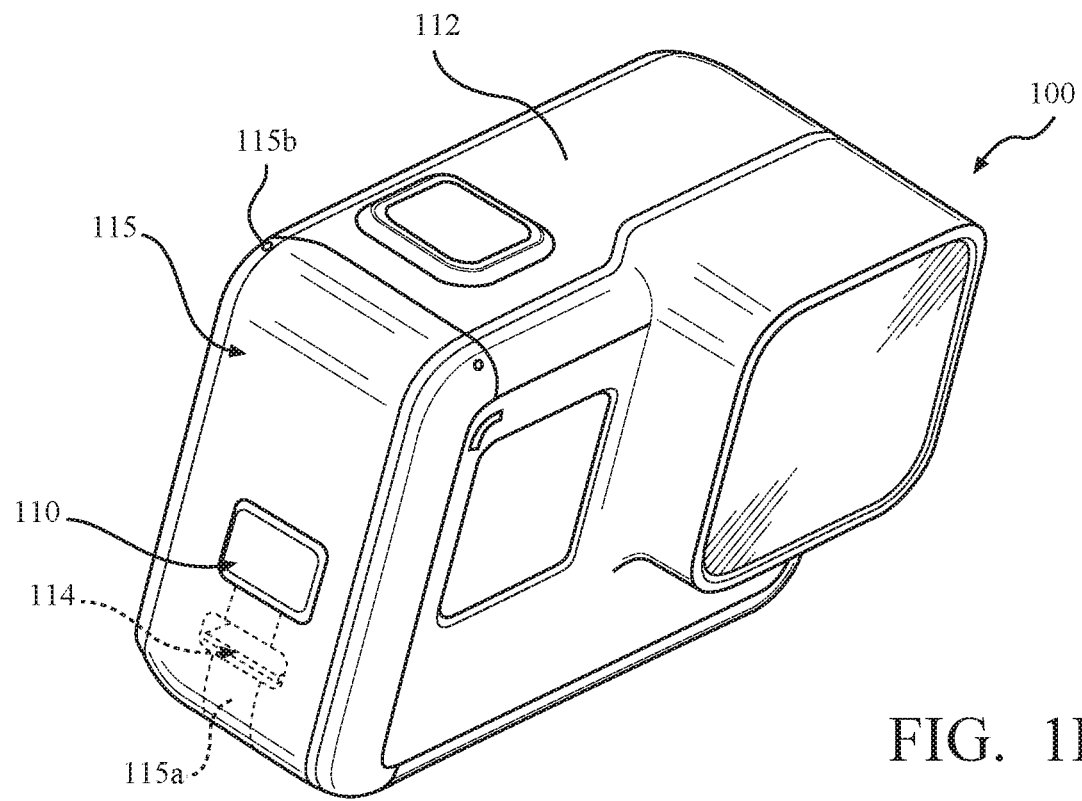
Figure 1C:
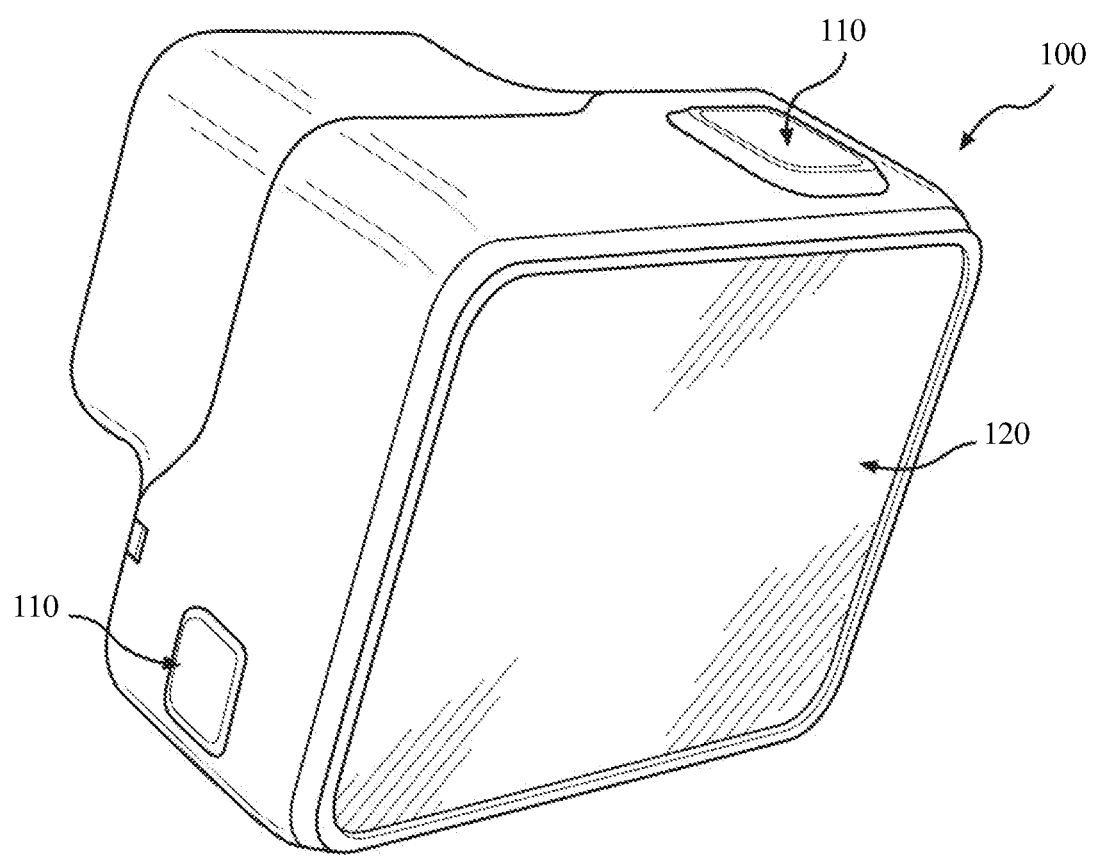

FIGS. 1A-C are perspective views of an example of an image capture device 100. The image capture device 100 may include a body 102 having a lens 104 structured on a front surface of the body 102, various indicators on the front of the surface of the body 102 (such as LEDs, displays, and the like), various input mechanisms (such as buttons, switches, and touch-screen mechanisms), and electronics (e.g., imaging electronics, power electronics, etc.) internal to the body 102 for capturing images via the lens 104 and/or performing other functions. The image capture device 100 may be configured to capture images and video and to store captured images and video for subsequent display or playback.

The image capture device 100 may include various indicators, including LED lights 106 and LCD display 108. The image capture device 100 may also include buttons 110 configured to allow a user of the image capture device 100 to interact with the image capture device 100, to turn the image capture device 100 on, to operate latches or hinges associated with doors of the image capture device 100, and/or to otherwise configure the operating mode of the image capture device 100. The image capture device 100 may also include a microphone 112 configured to receive and record audio signals in conjunction with recording video.

The image capture device 100 may include an I/O interface 114 (e.g., hidden as indicated using dotted lines). As best shown in FIG. 1B, the I/O interface 114 can be covered and sealed by a removable door 115 of the image capture device 100. The removable door 115 can be secured, for example, using a latch mechanism 115a (e.g., hidden as indicated using dotted lines) that is opened by engaging the associated button 110 as shown.

The removable door 115 can also be secured to the image capture device 100 using a hinge mechanism 115b, allowing the removable door 115 to pivot between an open position allowing access to the I/O interface 114 and a closed position blocking access to the I/O interface 114. The removable door 115 can also have a removed position (not shown) where the entire removable door 115 is separated from the image capture device 100, that is, where both the latch mechanism 115a and the hinge mechanism 115b allow the removable door 115 to be removed from the image capture device 100.

The image capture device 100 may also include another microphone integrated into the body 102 or housing. The front surface of the image capture device 100 may include two drainage ports as part of a drainage channel. The image capture device 100 may include an interactive display 120 that allows for interaction with the image capture device 100 while simultaneously displaying information on a surface of the image capture device 100. As illustrated, the image capture device 100 may include the lens 104 that is configured to receive light incident upon the lens 104 and to direct received light onto an image sensor internal to the lens 104.

The image capture device 100 of FIGS. 1A-C includes an exterior that encompasses and protects internal electronics. In the present example, the exterior includes six surfaces (i.e. a front face, a left face, a right face, a back face, a top face, and a bottom face) that form a rectangular cuboid. Furthermore, both the front and rear surfaces of the image capture device 100 are rectangular. In other embodiments, the exterior may have a different shape. The image capture device 100 may be made of a rigid material such as plastic, aluminum, steel, or fiberglass. The image capture device 100 may include features other than those described here. For example, the image capture device 100 may include additional buttons or different interface features, such as interchangeable lenses, cold shoes and hot shoes that can add functional features to the image capture device 100, etc.

The image capture device 100 may include various types of image sensors, such as a charge-coupled device (CCD) sensors, active pixel sensors (APS), complementary metal-oxide-semiconductor (CMOS) sensors, N-type metal-oxide-semiconductor (NMOS) sensors, and/or any other image sensor or combination of image sensors.

Although not illustrated, in various embodiments, the image capture device 100 may include other additional electrical components (e.g., an image processor, camera SoC (system-on-chip), etc.), which may be included on one or more circuit boards within the body 102 of the image capture device 100.

The image capture device 100 may interface with or communicate with an external device, such as an external user interface device, via a wired or wireless computing communication link (e.g., the I/O interface 114). The user interface device may, for example, be the personal computing device 360 described below with respect to FIG. 3B. Any number of computing communication links may be used. The computing communication link may be a direct computing communication link or an indirect computing communication link, such as a link including another device or a network, such as the internet, may be used.

In some implementations, the computing communication link may be a Wi-Fi link, an infrared link, a Bluetooth (BT) link, a cellular link, a ZigBee link, a near field communications (NFC) link, such as an ISO/IEC 20643 protocol link, an Advanced Network Technology interoperability (ANT+) link, and/or any other wireless communications link or combination of links.

In some implementations, the computing communication link may be an HDMI link, a USB link, a digital video interface link, a display port interface link, such as a Video Electronics Standards Association (VESA) digital display interface link, an Ethernet link, a Thunderbolt link, and/or other wired computing communication link.

The image capture device 100 may transmit images, such as panoramic images, or portions thereof, to the user interface device (not shown) via the computing communication link, and the user interface device may store, process, display, or a combination thereof the panoramic images.

The user interface device may be a computing device, such as a smartphone, a tablet computer, a phablet, a smart watch, a portable computer, and/or another device or combination of devices configured to receive user input, communicate information with the image capture device 100 via the computing communication link, or receive user input and communicate information with the image capture device 100 via the computing communication link.22

The user interface device may display, or otherwise present, content, such as images or video, acquired by the image capture device 100. For example, a display of the user interface device may be a viewport into the three-dimensional space represented by the panoramic images or video captured or created by the image capture device 100.

The user interface device may communicate information, such as metadata, to the image capture device 100. For example, the user interface device may send orientation information of the user interface device with respect to a defined coordinate system to the image capture device 100, such that the image capture device 100 may determine an orientation of the user interface device relative to the image capture device 100.

Based on the determined orientation, the image capture device 100 may identify a portion of the panoramic images or video captured by the image capture device 100 for the image capture device 100 to send to the user interface device for presentation as the viewport. In some implementations, based on the determined orientation, the image capture device 100 may determine the location of the user interface device and/or the dimensions for viewing of a portion of the panoramic images or video.

The user interface device may implement or execute one or more applications to manage or control the image capture device 100. For example, the user interface device may include an application for controlling camera configuration, video acquisition, video display, or any other configurable or controllable aspect of the image capture device 100.

The user interface device, such as via an application, may generate and share, such as via a cloud-based or social media service, one or more images, or short video clips, such as in response to user input. In some implementations, the user interface device, such as via an application, may remotely control the image capture device 100 such as in response to user input.

The user interface device, such as via an application, may display unprocessed or minimally processed images or video captured by the image capture device 100 contemporaneously with capturing the images or video by the image capture device 100, such as for shot framing, which may be referred to herein as a live preview, and which may be performed in response to user input. In some implementations, the user interface device, such as via an application, may mark one or more key moments contemporaneously with capturing the images or video by the image capture device 100, such as with a tag, such as in response to user input.

The user interface device, such as via an application, may display, or otherwise present, marks or tags associated with images or video, such as in response to user input. For example, marks may be presented in a camera roll application for location review and/or playback of video highlights.

The user interface device, such as via an application, may wirelessly control camera software, hardware, or both. For example, the user interface device may include a web-based graphical interface accessible by a user for selecting a live or previously recorded video stream from the image capture device 100 for display on the user interface device.

The user interface device may receive information indicating a user setting, such as an image resolution setting (e.g., 3840 pixels by 2160 pixels), a frame rate setting (e.g., 60 frames per second (fps)), a location setting, and/or a context setting, which may indicate an activity, such as mountain biking, in response to user input, and may communicate the settings, or related information, to the image capture device 100.

Figure 2A:
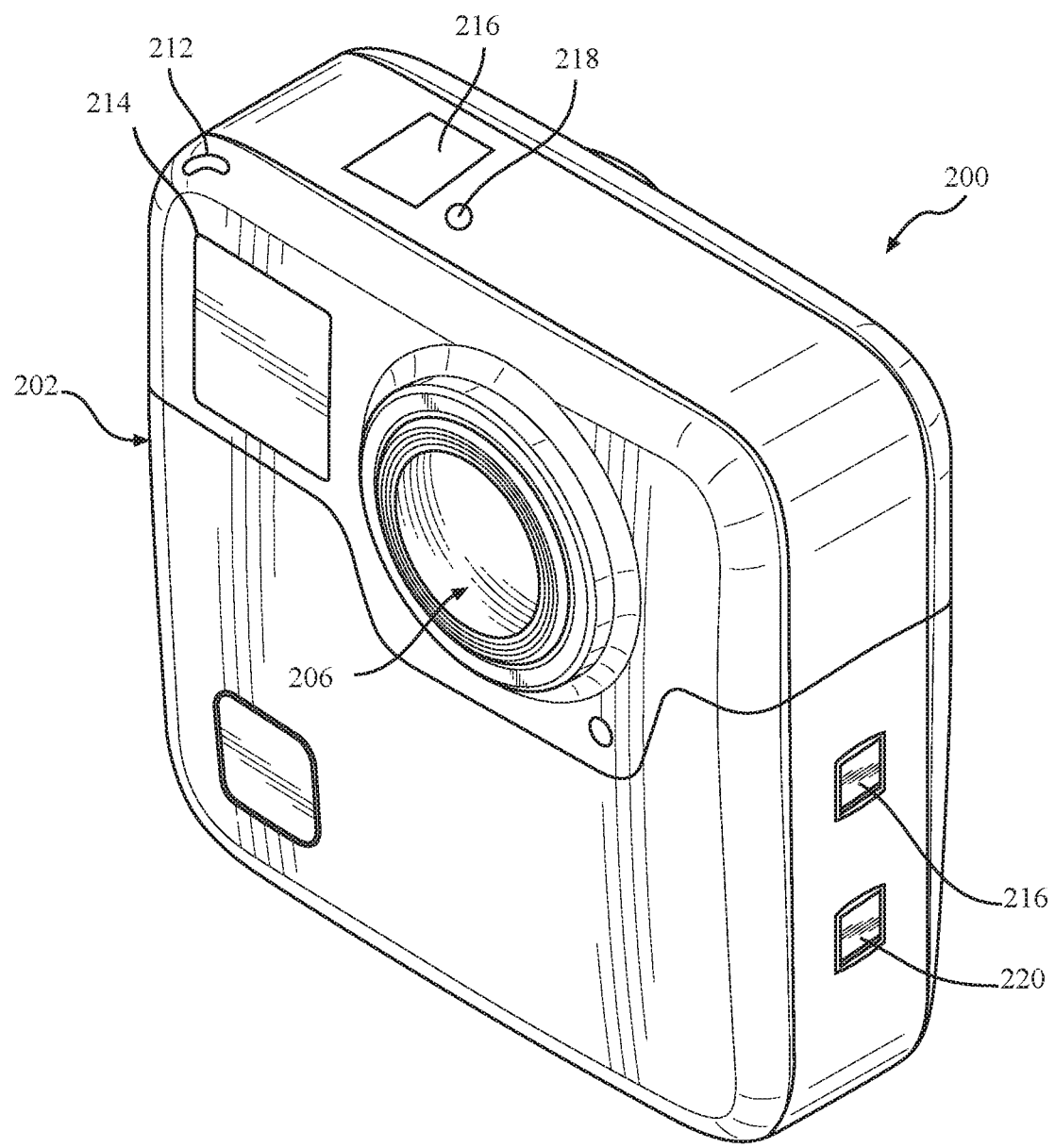
FIGS. 2A-B are perspective views of another example of an image capture device.
Figure 2B:
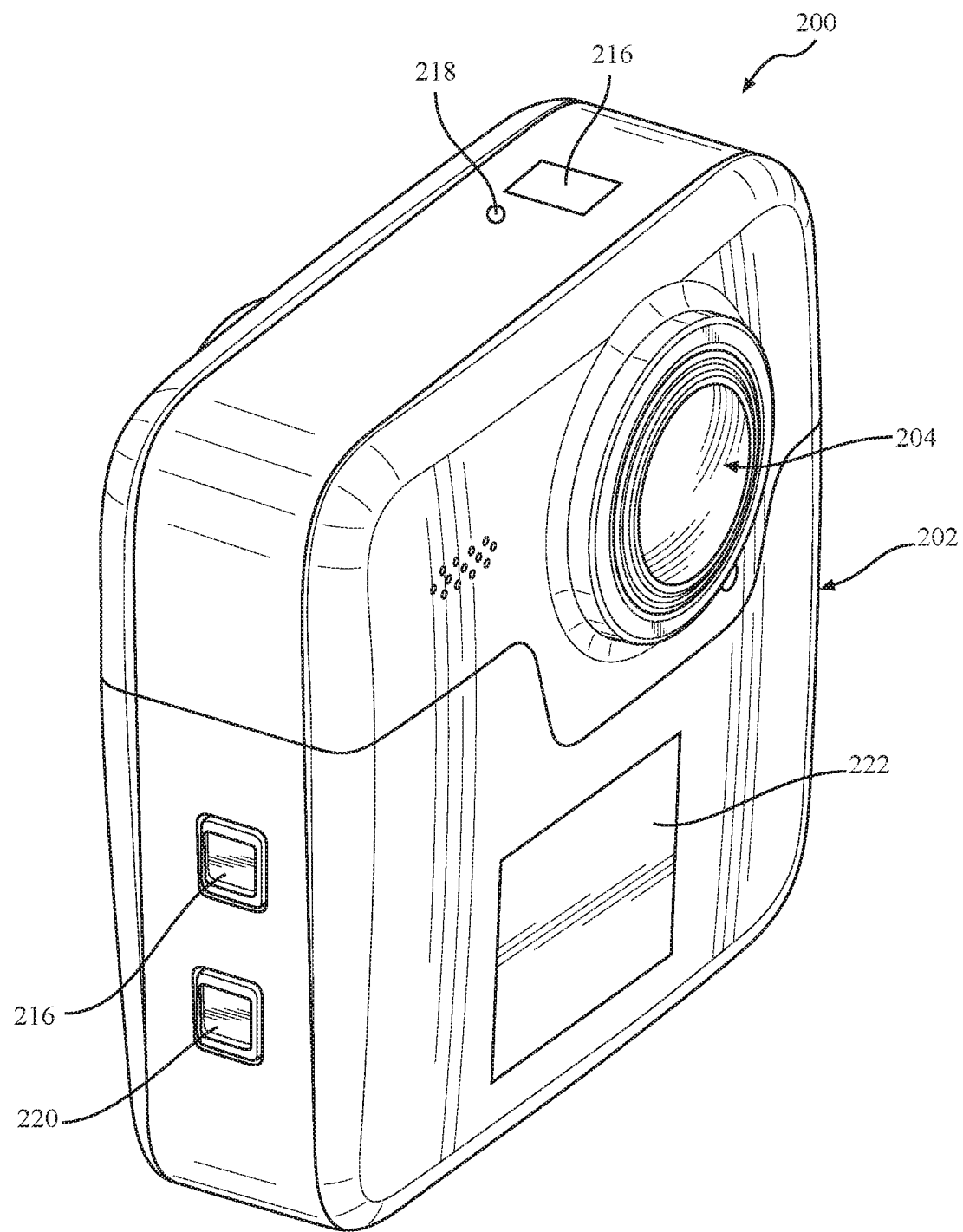

FIGS. 2A-B illustrate another example of an image capture device 200. The image capture device 200 includes a body 202 and two camera lenses 204, 206 disposed on opposing surfaces of the body 202, for example, in a back-to-back or Janus configuration.

The image capture device may include electronics (e.g., imaging electronics, power electronics, etc.) internal to the body 202 for capturing images via the lenses 204, 206 and/or performing other functions. The image capture device may include various indicators such as an LED light 212 and an LCD display 214.

The image capture device 200 may include various input mechanisms such as buttons, switches, and touchscreen mechanisms. For example, the image capture device 200 may include buttons 216 configured to allow a user of the image capture device 200 to interact with the image capture device 200, to turn the image capture device 200 on, and to otherwise configure the operating mode of the image capture device 200. In an implementation, the image capture device 200 includes a shutter button and a mode button. It should be appreciated, however, that, in alternate embodiments, the image capture device 200 may include additional buttons to support and/or control additional functionality.

The image capture device 200 may also include one or more microphones 218 configured to receive and record audio signals (e.g., voice or other audio commands) in conjunction with recording video.

The image capture device 200 may include an I/O interface 220 and an interactive display 222 that allows for interaction with the image capture device 200 while simultaneously displaying information on a surface of the image capture device 200.

The image capture device 200 may be made of a rigid material such as plastic, aluminum, steel, or fiberglass. In some embodiments, the image capture device 200 described herein includes features other than those described. For example, instead of the I/O interface 220 and the interactive display 222, the image capture device 200 may include additional interfaces or different interface features. For example, the image capture device 200 may include additional buttons or different interface features, such as interchangeable lenses, cold shoes and hot shoes that can add functional features to the image capture device 200, etc.

Figure 2C:
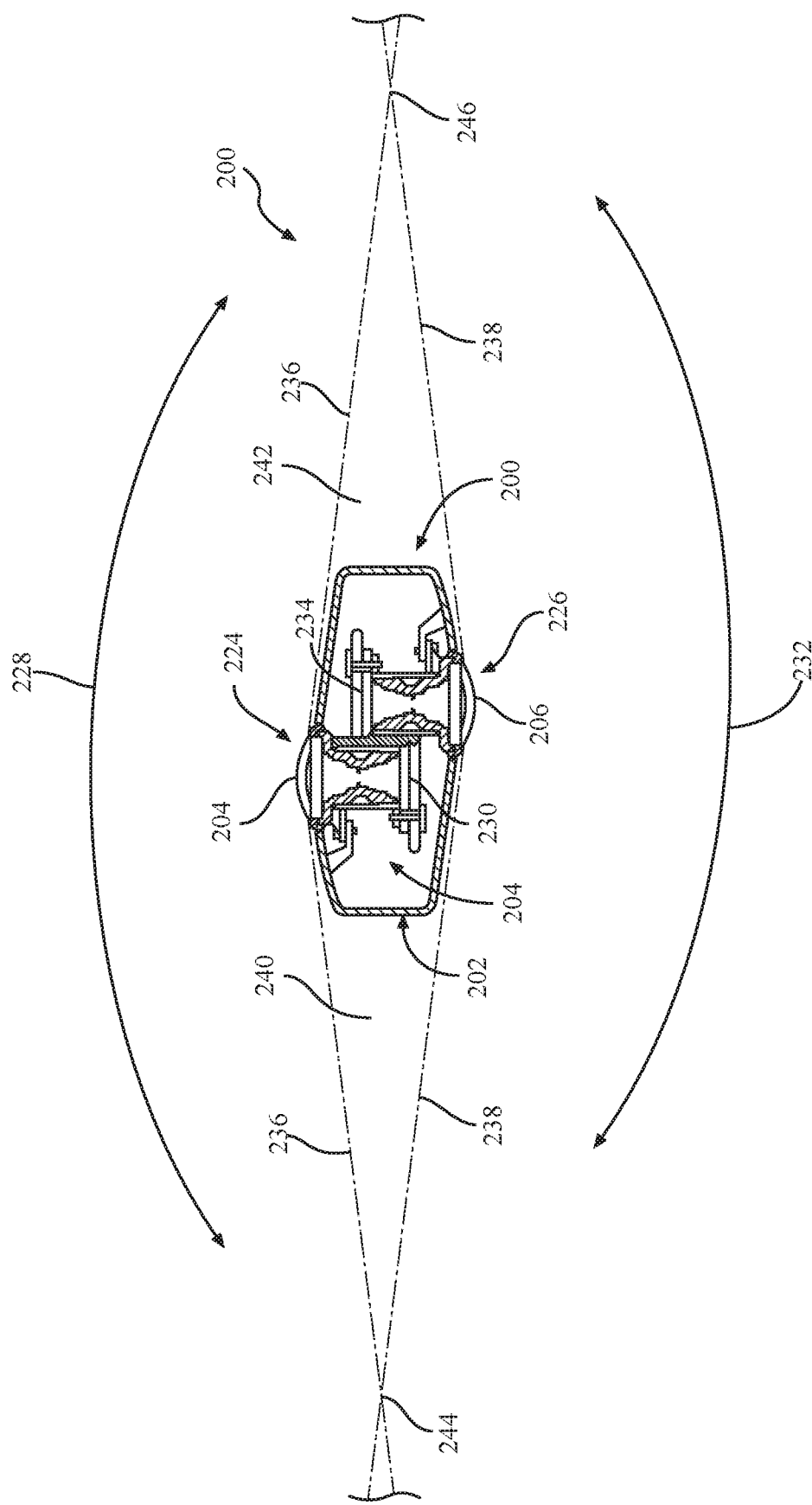
FIG. 2C is a cross-sectional view of the image capture device of FIGS. 2A-B.

FIG. 2C is a cross-sectional view of the image capture device 200 of FIGS. 2A-B. The image capture device 200 is configured to capture spherical images, and accordingly, includes a first image capture device 224 and a second image capture device 226. The first image capture device 224 defines a first field-of-view 228 as shown in FIG. 2C and includes the lens 204 that receives and directs light onto a first image sensor 230.

Similarly, the second image capture device 226 defines a second field-of-view 232 as shown in FIG. 2C and includes the lens 206 that receives and directs light onto a second image sensor 234. To facilitate the capture of spherical images, the image capture devices 224, 226 (and related components) may be arranged in a back-to-back (Janus) configuration such that the lenses 204, 206 face in generally opposite directions.

The fields-of-view 228, 232 of the lenses 204, 206 are shown above and below boundaries 236, 238, respectively. Behind the first lens 204, the first image sensor 230 may capture a first hyper-hemispherical image plane from light entering the first lens 204, and behind the second lens 206, the second image sensor 234 may capture a second hyper-hemispherical image plane from light entering the second lens 206.

One or more areas, such as blind spots 240, 242 may be outside of the fields-of-view 228, 232 of the lenses 204, 206 so as to define a "dead zone." In the dead zone, light may be obscured from the lenses 204, 206 and the corresponding image sensors 230, 234, and content in the blind spots 240, 242 may be omitted from capture. In some implementations, the image capture devices 224, 226 may be configured to minimize the blind spots 240, 242.

The fields-of-view 228, 232 may overlap. Stitch points 244, 246, proximal to the image capture device 200, at which the fields-of-view 228, 232 overlap may be referred to herein as overlap points or stitch points. Content captured by the respective lenses 204, 206, distal to the stitch points 244, 246, may overlap.

Images contemporaneously captured by the respective image sensors 230, 234 may be combined to form a combined image. Combining the respective images may include correlating the overlapping regions captured by the respective image sensors 230, 234, aligning the captured fields-of-view 228, 232, and stitching the images together to form a cohesive combined image.

A slight change in the alignment, such as position and/or tilt, of the lenses 204, 206, the image sensors 230, 234, or both, may change the relative positions of their respective fields-of-view 228, 232 and the locations of the stitch points 244, 246. A change in alignment may affect the size of the blind spots 240, 242, which may include changing the size of the blind spots 240, 242 unequally.

Incomplete or inaccurate information indicating the alignment of the image capture devices 224, 226, such as the locations of the stitch points 244, 246, may decrease the accuracy, efficiency, or both of generating a combined image. In some implementations, the image capture device 200 may maintain information indicating the location and orientation of the lenses 204, 206 and the image sensors 230, 234 such that the fields-of-view 228, 232, stitch points 244, 246, or both may be accurately determined, which may improve the accuracy, efficiency, or both of generating a combined image.

The lenses 204, 206 may be laterally offset from each other, may be off-center from a central axis of the image capture device 200, or may be laterally offset and off-center from the central axis. As compared to image capture devices with back-to-back lenses, such as lenses aligned along the same axis, image capture devices including laterally offset lenses may include substantially reduced thickness relative to the lengths of the lens barrels securing the lenses. For example, the overall thickness of the image capture device 200 may be close to the length of a single lens barrel as opposed to twice the length of a single lens barrel as in a back-to-back configuration. Reducing the lateral distance between the lenses 204, 206 may improve the overlap in the fields-of-view 228, 232.

Images or frames captured by the image capture devices 224, 226 may be combined, merged, or stitched together to produce a combined image, such as a spherical or panoramic image, which may be an equirectangular planar image. In some implementations, generating a combined image may include three-dimensional, or spatiotemporal, noise reduction (3DNR). In some implementations, pixels along the stitch boundary may be matched accurately to minimize boundary discontinuities.

FIGS. 3A-B are block diagrams of examples of image capture systems.

Referring first to FIG. 3A, an image capture system 300 is shown. The image capture system 300 includes an image capture device 310 (e.g., a camera or a drone), which may, for example, be the image capture device 200 shown in FIGS. 2A-C.

The image capture device 310 includes a processing apparatus 312 that is configured to receive a first image from a first image sensor 314 and receive a second image from a second image sensor 316. The image capture device 310 includes a communications interface 318 for transferring images to other devices. The image capture device 310 includes a user interface 320 to allow a user to control image capture functions and/or view images. The image capture device 310 includes a battery 322 for powering the image capture device 310. The components of the image capture device 310 may communicate with each other via the bus 324.

The processing apparatus 312 may be configured to perform image signal processing (e.g., filtering, tone mapping, stitching, and/or encoding) to generate output images based on image data from the image sensors 314 and 316. The processing apparatus 312 may include one or more processors having single or multiple processing cores. The processing apparatus 312 may include memory, such as a random-access memory device (RAM), flash memory, or another suitable type of storage device such as a non-transitory computer-readable memory. The memory of the processing apparatus 312 may include executable instructions and data that can be accessed by one or more processors of the processing apparatus 312.

For example, the processing apparatus 312 may include one or more dynamic random access memory (DRAM) modules, such as double data rate synchronous dynamic random-access memory (DDR SDRAM). In some implementations, the processing apparatus 312 may include a digital signal processor (DSP). In some implementations, the processing apparatus 312 may include an application specific integrated circuit (ASIC). For example, the processing apparatus 312 may include a custom image signal processor.

The first image sensor 314 and the second image sensor 316 may be configured to detect light of a certain spectrum (e.g., the visible spectrum or the infrared spectrum) and convey information constituting an image as electrical signals (e.g., analog or digital signals). For example, the image sensors 314 and 316 may include CCDs or active pixel sensors in a CMOS. The image sensors 314 and 316 may detect light incident through a respective lens (e.g., a fisheye lens). In some implementations, the image sensors 314 and 316 include digital-to-analog converters. In some implementations, the image sensors 314 and 316 are held in a fixed orientation with respective fields of view that overlap.

The communications interface 318 may enable communications with a personal computing device (e.g., a smartphone, a tablet, a laptop computer, or a desktop computer). For example, the communications interface 318 may be used to receive commands controlling image capture and processing in the image capture device 310. For example, the communications interface 318 may be used to transfer image data to a personal computing device. For example, the communications interface 318 may include a wired interface, such as a high-definition multimedia interface (HDMI), a universal serial bus (USB) interface, or a FireWire interface. For example, the communications interface 318 may include a wireless interface, such as a Bluetooth interface, a ZigBee interface, and/or a Wi-Fi interface.

The user interface 320 may include an LCD display for presenting images and/or messages to a user. For example, the user interface 320 may include a button or switch enabling a person to manually turn the image capture device 310 on and off. For example, the user interface 320 may include a shutter button for snapping pictures.

The battery 322 may power the image capture device 310 and/or its peripherals. For example, the battery 322 may be charged wirelessly or through a micro-USB interface.

Referring to FIG. 3B, another image capture system 330 is shown. The image capture system 330 includes an image capture device 340 and a personal computing device 360 that communicate via a communications link 350. The image capture device 340 may, for example, be the image capture device 100 shown in FIGS. 1A-C. The personal computing device 360 may, for example, be the user interface device described with respect to FIGS. 1A-C.

The image capture device 340 includes an image sensor 342 that is configured to capture images. The image capture device 340 includes a communications interface 344 configured to transfer images via the communication link 350 to the personal computing device 360.

The personal computing device 360 includes a processing apparatus 362 that is configured to receive, using a communications interface 366, images from the image sensor 342. The processing apparatus 362 may be configured to perform image signal processing (e.g., filtering, tone mapping, stitching, and/or encoding) to generate output images based on image data from the image sensor 342.

The image sensor 342 is configured to detect light of a certain spectrum (e.g., the visible spectrum or the infrared spectrum) and convey information constituting an image as electrical signals (e.g., analog or digital signals). For example, the image sensor 342 may include CCDs or active pixel sensors in a CMOS. The image sensor 342 may detect light incident through a respective lens (e.g., a fisheye lens). In some implementations, the image sensor 342 includes digital-to-analog converters. Image signals from the image sensor 342 may be passed to other components of the image capture device 340 via a bus 346.

The communications link 350 may be a wired communications link or a wireless communications link. The communications interface 344 and the communications interface 366 may enable communications over the communications link 350. For example, the communications interface 344 and the communications interface 366 may include an HDMI port or other interface, a USB port or other interface, a FireWire interface, a Bluetooth interface, a ZigBee interface, and/or a Wi-Fi interface. For example, the communications interface 344 and the communications interface 366 may be used to transfer image data from the image capture device 340 to the personal computing device 360 for image signal processing (e.g., filtering, tone mapping, stitching, and/or encoding) to generate output images based on image data from the image sensor 342.

The processing apparatus 362 may include one or more processors having single or multiple processing cores. The processing apparatus 362 may include memory, such as RAM, flash memory, or another suitable type of storage device such as a non-transitory computer-readable memory. The memory of the processing apparatus 362 may include executable instructions and data that can be accessed by one or more processors of the processing apparatus 362. For example, the processing apparatus 362 may include one or more DRAM modules, such as DDR SDRAM.

In some implementations, the processing apparatus 362 may include a DSP. In some implementations, the processing apparatus 362 may include an integrated circuit, for example, an ASIC. For example, the processing apparatus 362 may include a custom image signal processor. The processing apparatus 362 may exchange data (e.g., image data) with other components of the personal computing device 360 via a bus 368.

The personal computing device 360 may include a user interface 364. For example, the user interface 364 may include a touchscreen display for presenting images and/or messages to a user and receiving commands from a user. For example, the user interface 364 may include a button or switch enabling a person to manually turn the personal computing device 360 on and off In some implementations, commands (e.g., start recording video, stop recording video, or capture photo) received via the user interface 364 may be passed on to the image capture device 340 via the communications link 350.

Figure 4A:
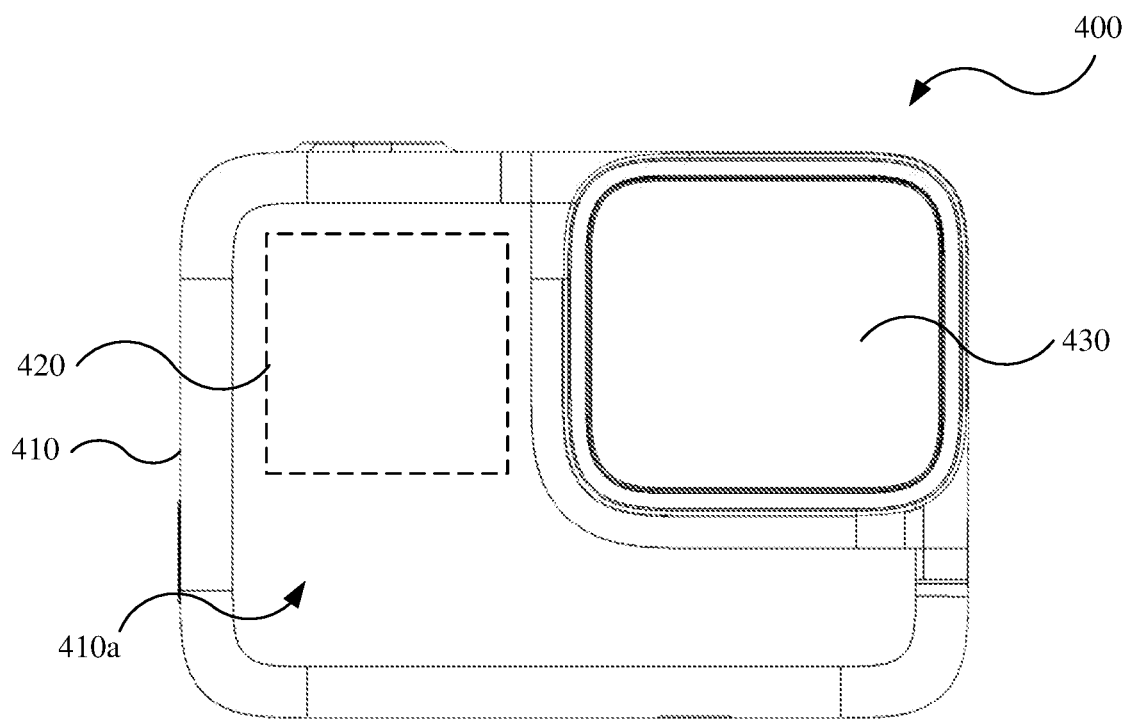
FIG. 4A is a front view of a camera with an outline of a display that is hidden shown in dashed lines.
Figure 4B:
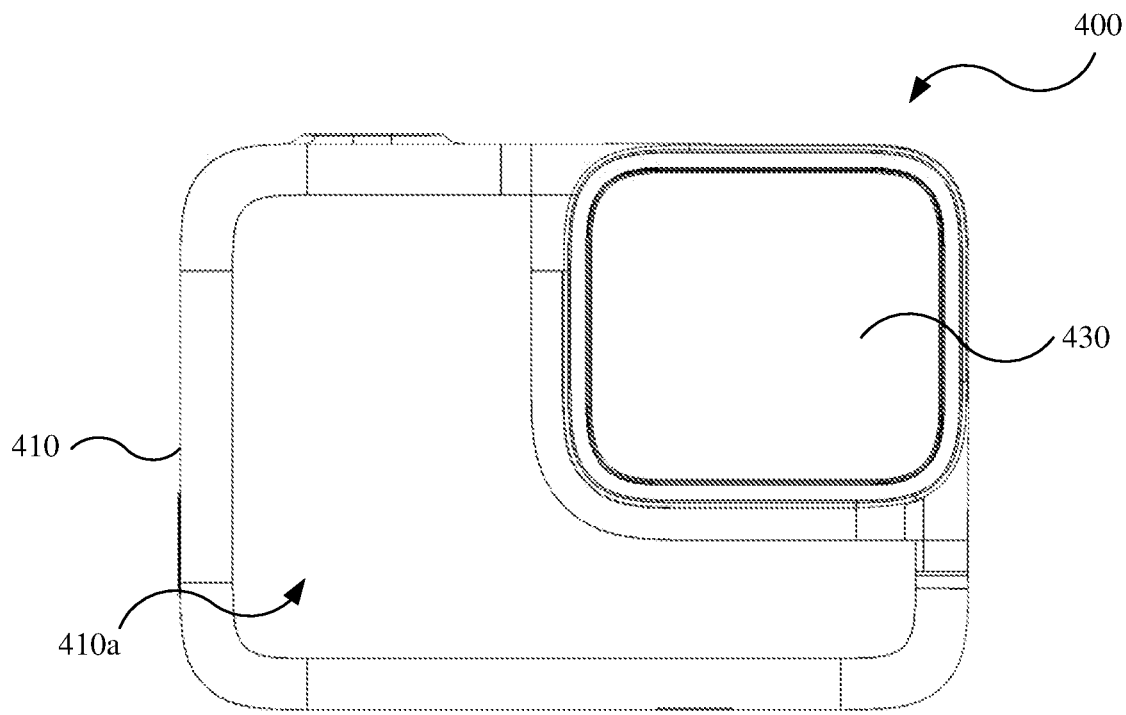
FIG. 4B is a front view of the camera.

Referring to FIGS. 4A-4B, a camera 400 is a variation of the image capture devices 100 and 200. The camera 400 includes a body 410, a display 420, a lens 430, and various electronics (discussed in further detail below). The body 410 forms a housing to which the display 420 and the lens 430 are coupled and in which are contained the various electronics. The display 420 is configured to display graphics on a first side 410a of the body 410. The lens 430 is coupled to the first side 410a of the body 410 and is configured to receive light therethrough for capturing images. While discussed with reference to the camera 400, which is illustrated as a single-lens camera, the display 420 may also be used with the camera 200 or another multi-lens camera.

As discussed in further detail below, the display 420 is substantially hidden from view when not illuminated. Thus, an outline of the display 420 is depicted in FIG. 4A with dashed lines to illustrate a location of the display 420, while FIG. 4B illustrated the camera 400 when the display is not illuminated.

Figure 5:
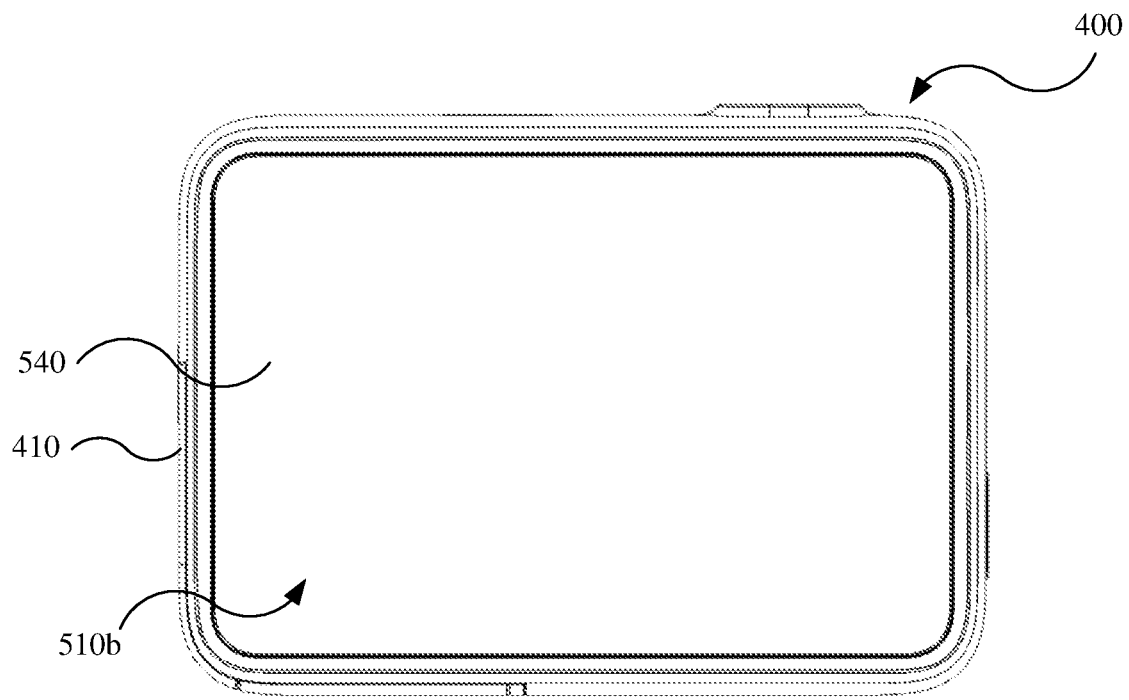
FIG. 5 is a rear view of the camera.

Referring to FIG. 5, the camera 400 may further include a second display 540 coupled to and configured to display graphics on a second side 510b of the body 410, which faces an opposite direction from the first side 410a. The other display 540 may be considered a primary display and may also function as an input device (e.g., a touch sensitive display) for receiving user inputs for controlling the camera 400. The second display 540 is suitable for displaying images captured by the camera 400. The second display 540 may have a resolution approximately 640×480 pixels or other suitable resolution (e.g., 320×540 pixels or 160×420 pixels). The second display 540 may have an aspect ratio of 4:3 (as shown), or another suitable aspect ratio (e.g., 1:1, 2:1, 16:9, or 3:2). The second display may also have a high pixel density (e.g., 160 ppi or greater, such as between approximately 200 and 500 ppi (pixels per inch)). The second display 540 may be any type of suitable display panel, such as a liquid crystal display (LCD), light-emitting diode display (LED), or organic light-emitting diode display (OLED).

Figure 6:
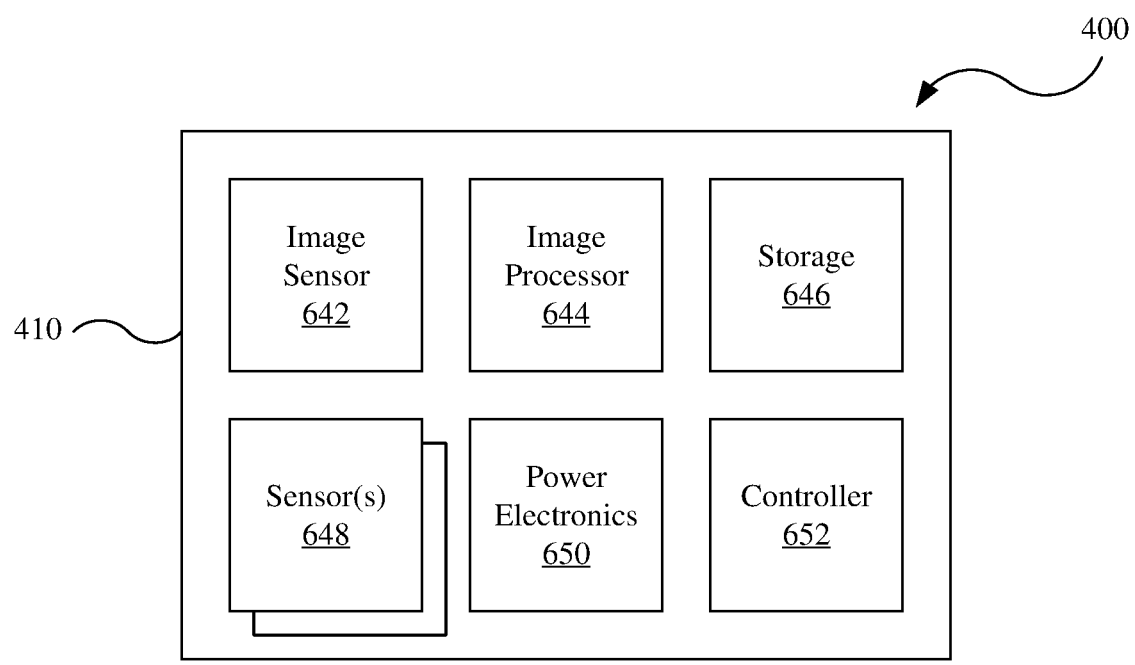
FIG. 6 is a schematic view of the camera.
Figure 7A:
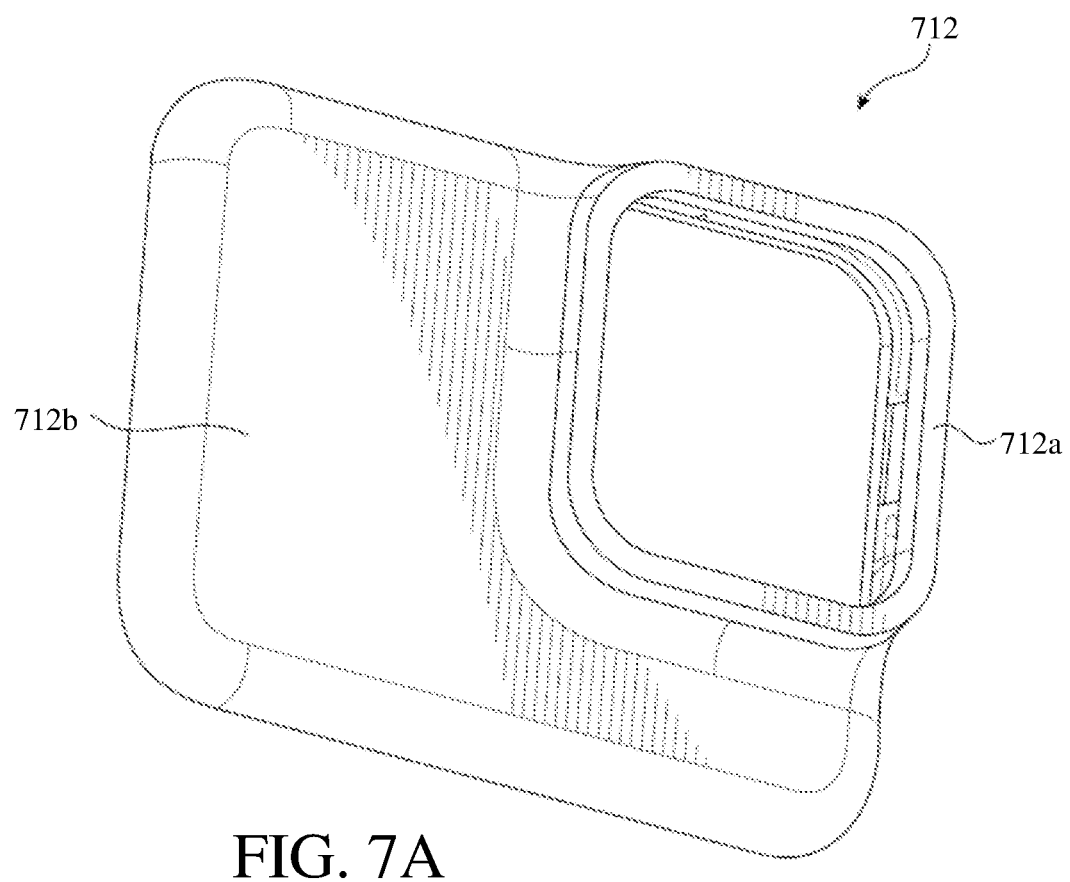
FIG. 7A is a front perspective view of a front housing portion of the camera.
Figure 7B:
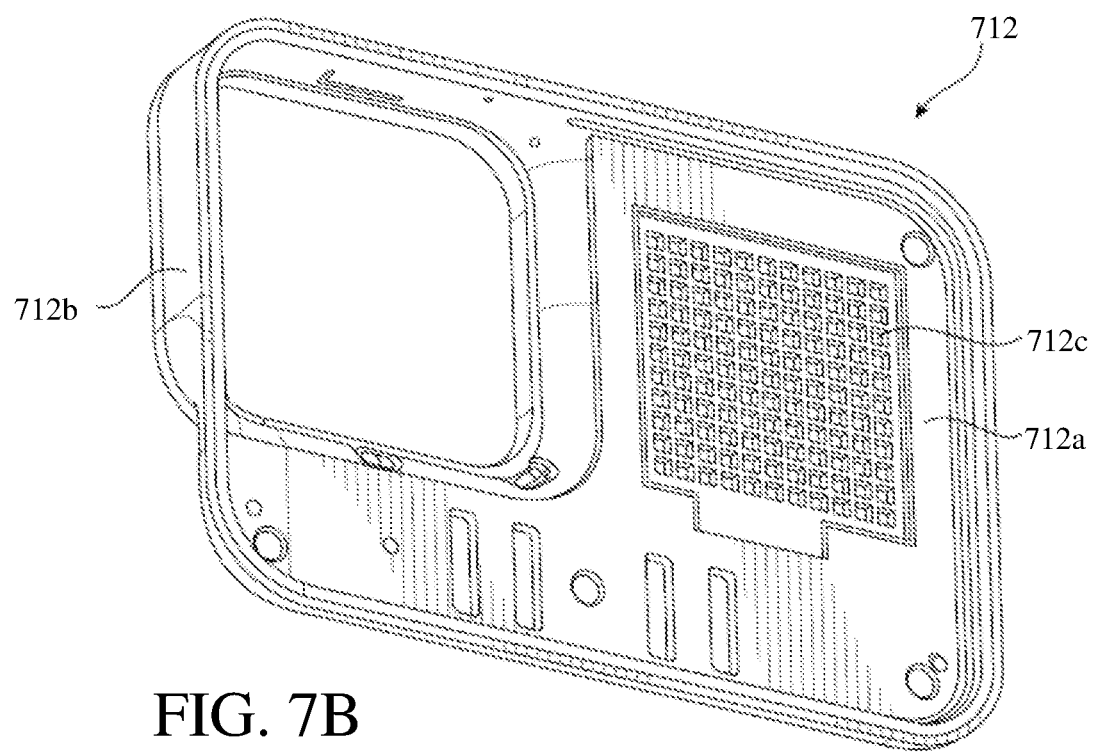
FIG. 7B is a rear perspective view of the front housing portion of the camera.
Figure 8:
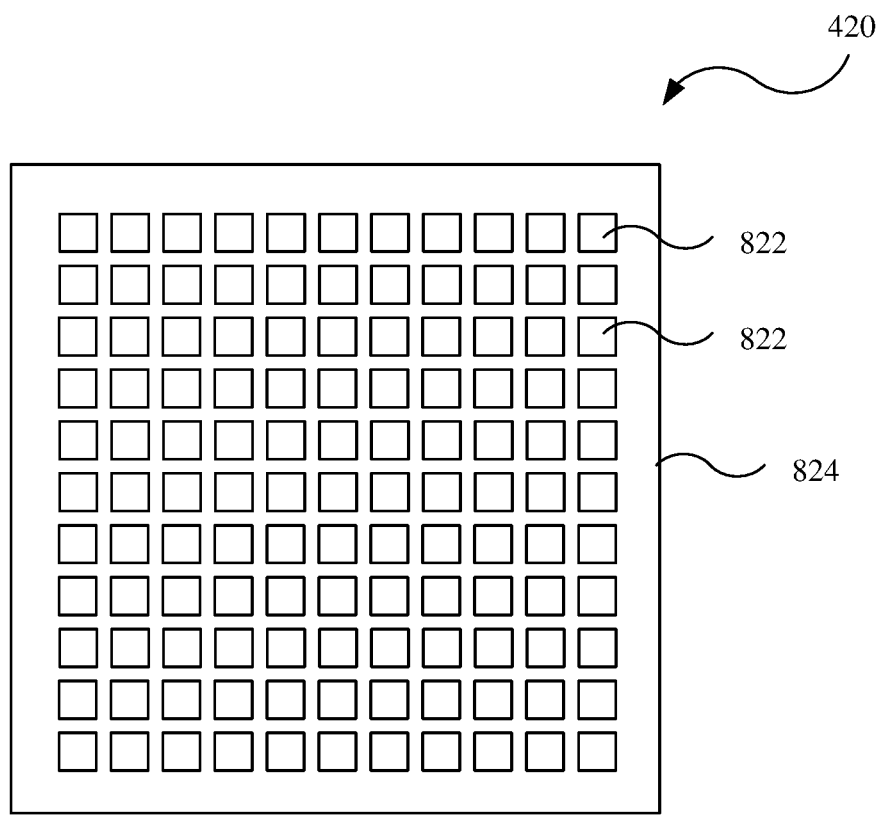
FIG. 8 is a front view of the display of the camera.
Figure 9:
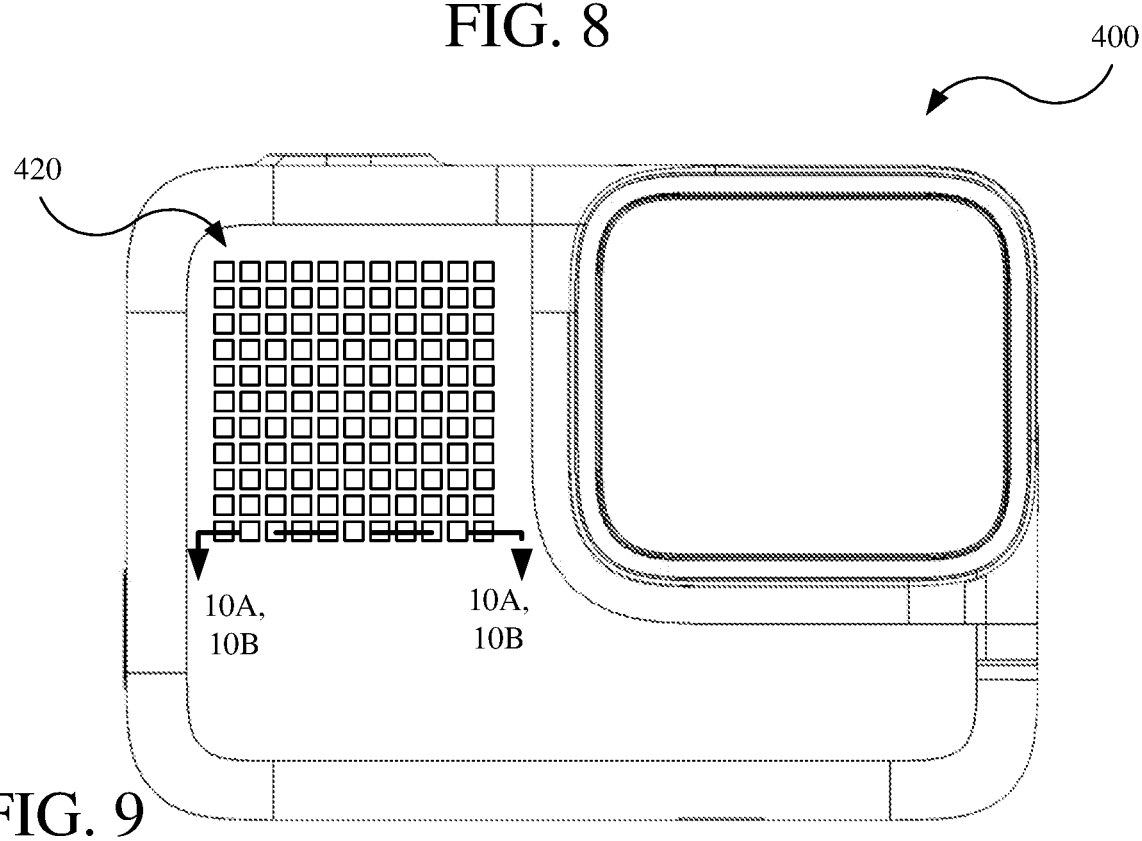
FIG. 9 is a front view of the camera with the display illuminated.
Figure 10A:
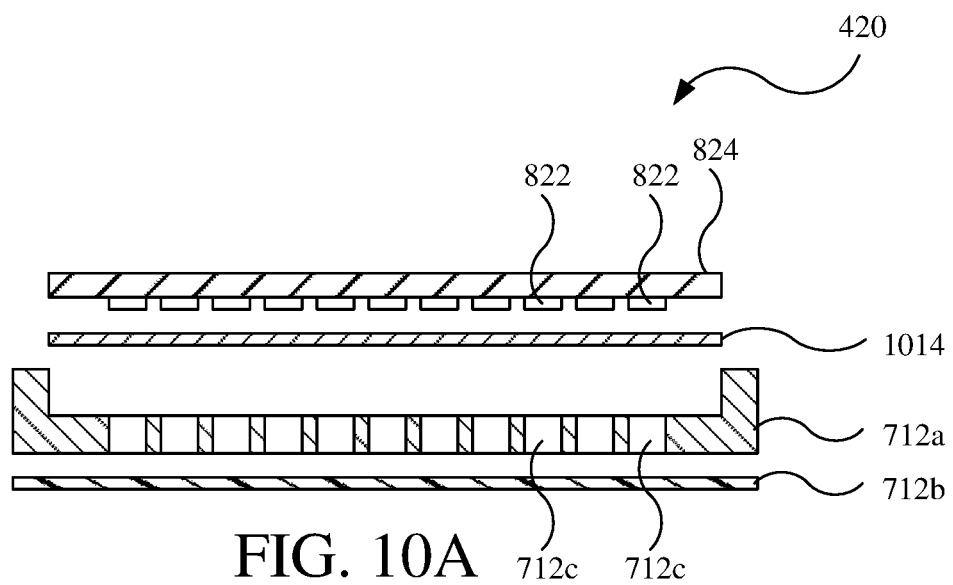
FIG. 10A is an exploded, partial cross-sectional view of the camera taken along line 10A-10A in FIG. 9.
Figure 10B:
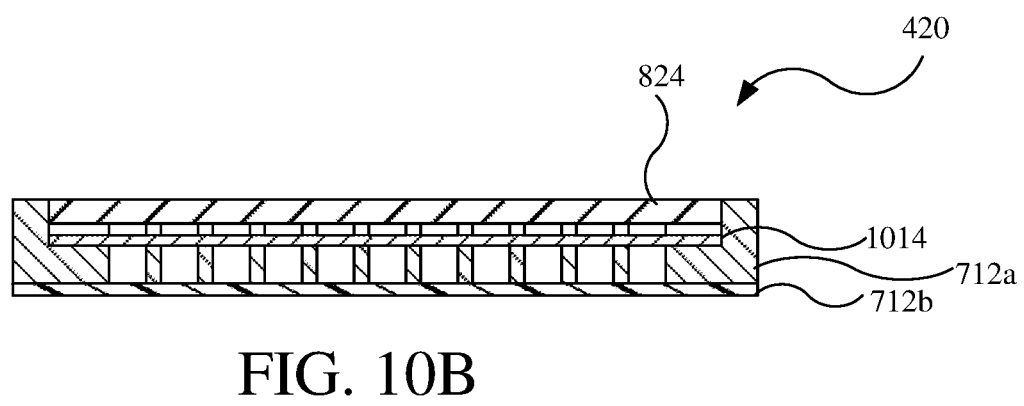
FIG. 10B is an assembled, partial cross-sectional view of the camera taken along line 10B-10B in FIG. 9.

The various electronics are generally contained within the body 410. As shown schematically in FIG. 6, the various electronics may, for example, include an image sensor 642, an image processor 644, a storage 646, sensors 648, power electronics 650, and a controller 652. The image sensor 642 and the image processor 644 are cooperatively configured with lens 430 to capture and process digital images (e.g., still images and/or video). The storage 646 is configured to store the digital images. The sensors 648, if included, are configured to sense one or more conditions, such as sound (e.g., a microphone), ambient light, and/or movement of the camera 400. The power electronics 650 (e.g., a battery) are configured to provide and/or store power for operating the camera 400. The controller 652 is a computing device in communication with and for operating the various other electronics and the display 420, which may include a processor (e.g., a CPU), memory (e.g., short-term volatile memory), a storage (e.g., long-term non-transitory memory), a communications interface for communicating with other electronic components of the camera 400, and a bus by which the components of the controller 652 are in communication with each other. The controller 652, for example, controls the various other electronics of the camera 400 by executing software programming stored in the storage thereof, including operation of the display 420 in the manners described below.

Referring again to FIGS. 4A-4B and FIGS. 7A-7B, the body 410 is a rigid structure that generally defines the outer shape of the camera 400, for example, as being rectangular in cross-section moving from the first side 410a to the second side 410b. The first side 410a of the body 410 may, for example be formed by a front housing portion 712. The front housing portion 712 includes an inner layer 712a (e.g., inner structure) and an outer layer 712b. The inner layer 712a is rigid provides rigidity to the body 410. The inner layer 712a is formed of a rigid material, such as a polymer (e.g., injection molded plastic). The outer layer 712b forms the outermost surface of the camera 400 to provide the outer surface appearance and texture to the body 410. The outer layer 712b is, for example, an elastomeric material (e.g., rubber). The outer layer 712b may be overmolded or otherwise coated or applied to the inner layer 712a. The body 410, such as the front housing portion 712 thereof, may include further layers (e.g., three or more layers) or materials (e.g., three or more distinct materials), which may vary by location.

Other sides of the camera 400 may be formed by other housing portions of the body 410 in whole or in part, such as top, left, right, and/or bottom sides thereof and/or include various other components (e.g., buttons to receive user inputs, doors for access to access to ports or connectors, and/or apertures). Such other housing portions of the body 410 may have a similar outer appearance to the front housing portion 712 (e.g., formed by the elastomeric material of the outer layer 712b) and/or may have a similar structure (e.g., the outer layer 712b on an underlying rigid structure). As shown in FIG. 5, the second display 540, or a lens thereover, may form a majority (e.g., a near entirety) of the second side 410b of the camera 400.

The display 420 is contained inside the body 410. The display 420 is substantially hidden from view when not illuminated and is viewable through the body 410 when illuminated. When illuminated, light emitted by the display 420 shines through the body 410, for example, through the front housing portion 712 thereof to display graphics to users (e.g., through apertures 712c in the inner layer 712a and through the outer layer 712b, as discussed in further detail below). The display 420 may also be referred to as a hidden display or a secondary display.

Referring to FIGS. 8-10B, the display 420 is configured as an array of lights 822 (e.g., a grid of lights), such as a grid of light-emitting diodes (LEDs), which may be coupled to a circuit board 824 or another suitable substrate. LEDs may, advantageously, consume relatively little power, as compared to the other electronics of the camera 400. The lights 822 are selectively illuminated to display graphics to users. The lights 822 are each of a fixed color (e.g., can output or emit only one dedicated color), or may be of multiple colors (e.g., can output or emit multiple colors, such as RGB). The lights 822 may be the same color as each other, or may have different colors. In the case of the lights 822 having different colors, a substantial majority of the lights (e.g., 85% or more) may have the same color (e.g., a common dedicated color, such as white), while a minority of the lights (e.g., 15% or less, such as those lights 822 in the four corners or adjacent thereto, or in particular row) are of a different color that may be the same as each other (e.g., all the lights 822 of the minority being red or RGB). In one specific example, the lights 822 in the four corners are red, while a remainder of the lights 822 are white. The lights 822 may have variable luminance, such that the brightness of each of the lights 822 may be selectively varied, or may have fixed luminance (e.g., being selectively illuminated in a binary on/off manner). Variable luminance may, for example, allow for different graphics (e.g., having lights 822 emitting light with different brightness) and/or adjusting to ambient lighting conditions (e.g., being brighter with high ambient light, such as in sunlight, and being dimmer with low ambient light, such as at night time). Ambient lighting conditions may, for example, be determined with the image sensor 642 and suitable image processing software (e.g., recognizing brightness) and/or an ambient light sensor of the sensors 648.

The display 420 has a low resolution, which may be defined by the lights 822 each forming one pixel. As shown, the display 420 has a resolution of 11×11 (i.e., 121 pixels or lights 822, such as an 11×11 grid of LEDs), but may have a higher resolution (e.g., pixel count of up to approximately 500 pixels) or lower resolution (e.g., pixel count of less than 121 pixels). For example, the display 420 may have a pixel count that is less than 1% (e.g., less than 0.5%, or less than 0.25%) of the resolution of the second display 540.

The display 420 may be relatively small as compared to the second display 540 and/or to the body 410 of the camera 400. For example, the display 420 may have a diagonal dimension of approximately one inch (measured from corner to corner), higher (e.g., greater than one inch, such as up to two inches), or lower (e.g., less than one inch, such as down to one-half inch). The second display 540 on the second side 510b of the camera 400 may, for example, have a diagonal dimension of approximately two inches, more (e.g., up to three inches), or less. As a result, the display 420 may have an area that is less than half the area of the second display 540 (e.g., between 10% and 40% of the area of the display 540, such as between 20% and 30% thereof), or lower such as 20% or less (e.g., 15% or less). The body 410 may, for example, have a horizontal dimension of approximately 2.5 inches and a vertical dimension of approximately 1.75 inches for an area of approximately 4.33 square inches, more, or less. As a result, the display 420 may have an area that is less than one quarter the area of the first side 410a of the camera 400 (e.g., between 5% and 20%, or between 10% and 15% of the first side 410a of the camera 400).

The display 420 has a relatively low pixel density. Pixel density may be measured of pixels per inch (ppi), such as the number of pixels in a linear inch. For example, the display 420 may have a pixel density of approximately fifteen ppi (i.e., 11×11 pixels for a diagonal display dimension of one inch), but may have a higher pixel density (e.g., up to approximately 40 ppi), a lower pixel density (e.g., below fifteen ppi), or other suitable pixel density (e.g., between 10 and 20 ppi). For example, the display 420 may have a pixel density that is approximately 20% or less than the pixel density of the second display 540 (e.g., 15%, 10%, 5%, or less).

Still referring to FIGS. 8-10B, as referenced above, the display 420 is hidden from view when not illuminated (e.g., none of the lights 822 thereof are illuminated) and is visible through the body 410 (e.g., through the front housing portion 712) when illuminated (e.g., when any of the lights 822 are selectively illuminated). More particularly, the outer layer 712b is configured to hide the display 420 from view therethrough when not illuminated, while allowing the display 420 to be viewed therethrough when illuminated (e.g., being sufficiently thin and translucent). Thus, light from the lights 822 that are selectively illuminated shines through the outer layer 712b, thereby allowing the display 420 to display graphics to the user.

The inner layer 712a is additionally configured to allow light emitted by the display 420 to be viewed therethrough when illuminated. For example, referring to FIG. 7B and the partial cross-sectional views of FIGS. 10A (exploded) and 10B, the inner layer 712a includes apertures 712c that are arranged in a grid and align with each of the lights 822 of the display 420 to, thereby, allow light to shine through the inner layer 712a and, thereby, through the front housing portion 712 of the body 410. The apertures 712c (e.g., the grid of apertures) are covered from view by the outer layer 712b. As is shown, the apertures 712c have a squared shape but may have any other suitable shape as may be appropriate for desired aesthetics and/or manufacturing (e.g., circular or otherwise rounded). Further, the lights 822 are illustrated schematically but may have a different shape and/or size relative to the apertures 712c. Still further, the lights 822 may be surrounded by individual tubes (e.g., light pipes or cylinders) that are opaque and function to prevent light from being emitted from adjacent ones of the apertures 712c but not associated therewith.

The display 420 may further include a light diffuser 1014 arranged between the grid of the lights 822 and the grid of the apertures 712c (e.g., between the inner layer 712a and the lights 822). The light emitted from each of the lights 822 is scattered by the light diffuser 1014 before passing through the apertures 712c and then the outer layer 712b. The scattering of light by the light diffuser 1014 may function to obscure the point location from which the light is emitted from the lights 822 through the apertures 712c, for example, making light appear to emit from the apertures 712c generally uniformly therefrom and/or regardless of the angle at which the display 420 is viewed by a person (e.g., a user). The light diffuser 1014 may, for example, be a sheet of translucent material.

The display 420 (e.g., the circuit board 824 thereof) is coupled to the body 410, for example, being coupled to the inner layer 712a of the front housing portion 712 with a suitable potting material (e.g., silicone epoxy, polyurethane, silicon, or other suitable electronics potting material or adhesive). For example, the circuit board 824 may be positioned within a recess having an inner profile that is complementary in shape to the circuit board 824, so as to properly locate the circuit board with respect to the front housing portion 712 for alignment of the lights 822 with the apertures 712c corresponding thereto.

The display 420 may provide various benefits or advantages over other types of displays or display screens. One benefit includes being hidden from view when not in use (e.g., when not illuminated), for example, by being hidden behind the outer layer 712b of the body 410. Another benefit may include the outer layer 712b diffusely reflecting ambient light (e.g., by having a rubber or otherwise matte surface), such that light emitted by the display 420 is viewable in bright conditions. In contrast, typical display screens are glossy and specularly reflect ambient light (e.g., by having a glass, clear plastic, or otherwise polished surface), which renders graphics unviewable in some conditions. As a still further benefit, the display 420 is contained entirely within the body 410 behind the outer layer 712b, thereby allowing the outer layer 712b to be continuous in regions of the display 420 (e.g., sealing the apertures 712c) to improve waterproofing by limiting potential leak paths into the body 410, as compared to a conventional display having a transparent material that abuts another material of a housing.

Example graphics that may be output by the display 420 include iconography (e.g., indicating particular mode of operation of the camera 400, such as aspect ratio), information (e.g., numerical timers indicating a length of a video recording or remaining time of a recording), feedback (e.g., for aligning the camera 400 to take a picture or video of the user, which may be referred to as a "selfie"), and/or animated graphics. Particular examples of graphics are discussed in further detail below with respect to FIGS. 11A-13B.

Figure 11A:
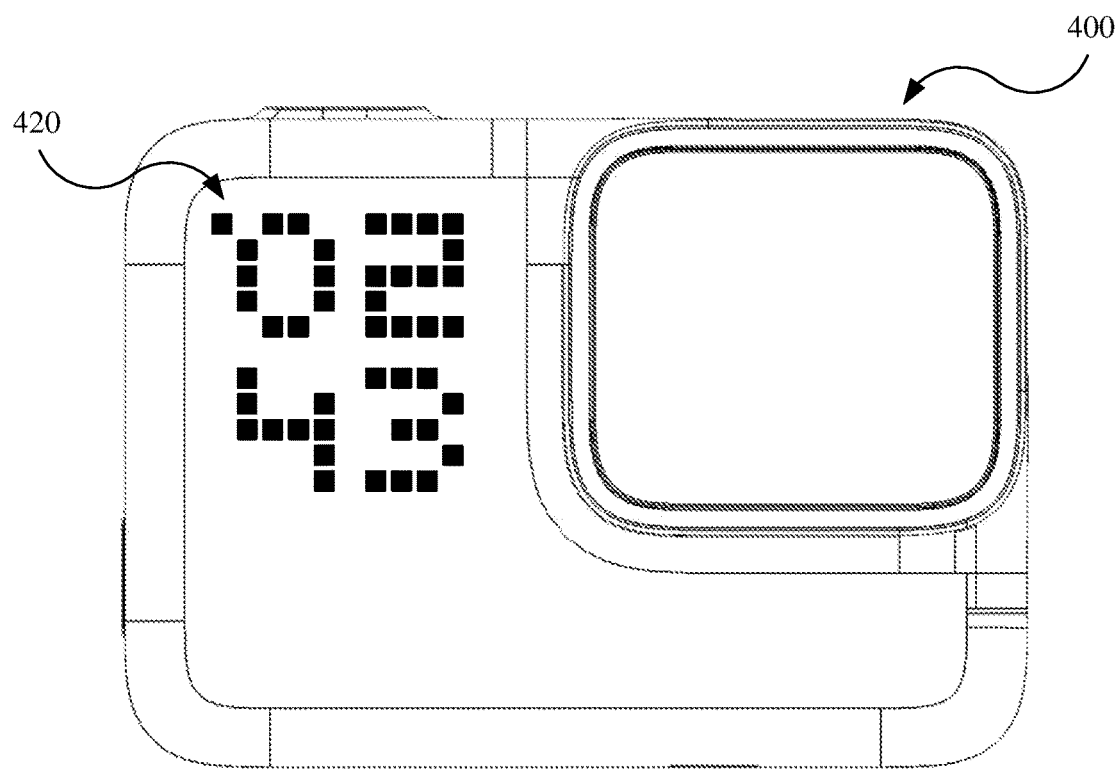
FIG. 11A is a front view of the camera in a first orientation with the display displaying a time indicator and a recording indicator.
Figure 11B:
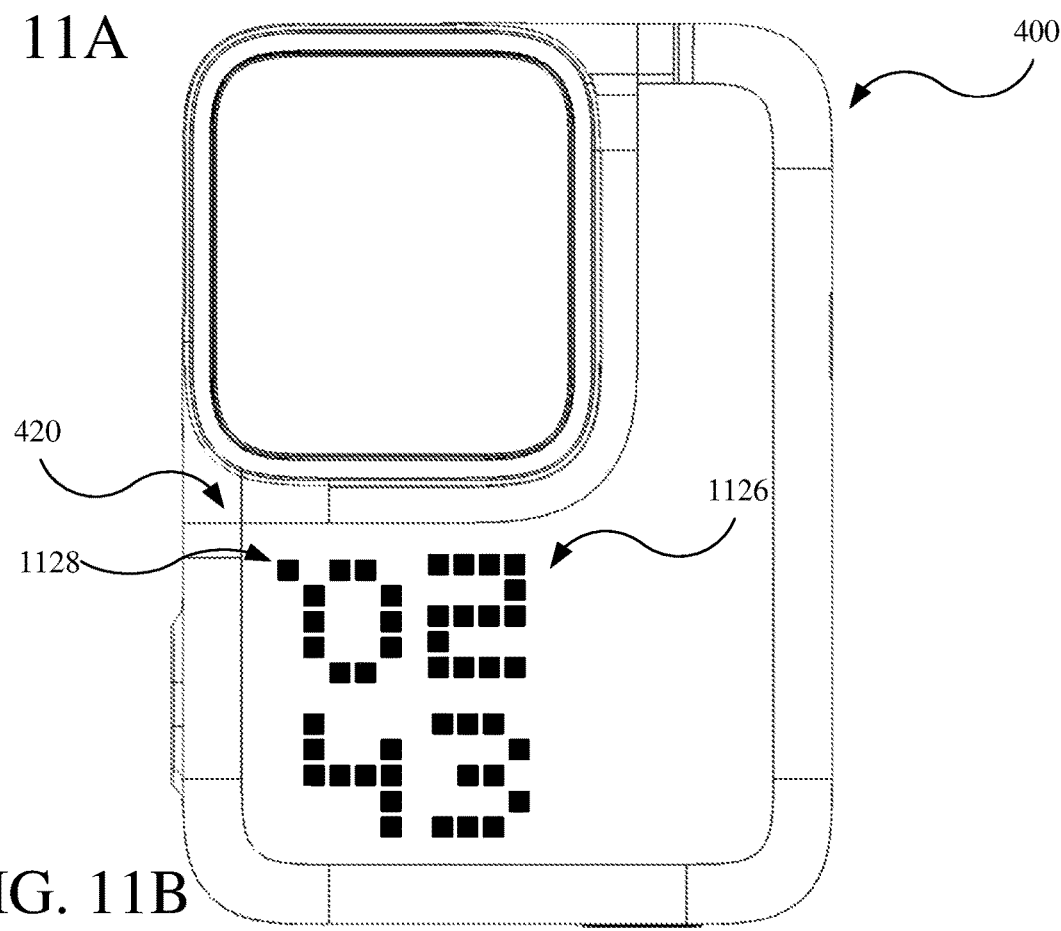
FIG. 11B is a front view of the camera in a second orientation with the display displaying the time indicator and the recording indicator.

Referring to FIGS. 11A-11B, in a recording mode, the display 420 is configured to display a time indicator 1126 as numerals and to display a recording indicator 1128 as a blinking or solid indicator. The time indicator 1126, for example, numerically indicates elapsed time of a recording or time remaining of a recording. The time indicator 1126 displays numerals, for example, as four numerals in a 2×2 arrangement (e.g., illustrating 2 minutes and 43 seconds, as shown). Each of the numerals may be taller than wide. For example, with the display 420 having an 11×11 grid of the lights 822, each numeral may be four pixels wide by five pixels high and be separated from each other numeral by a row or column of the lights 822 that are unilluminated. As a result, the time indicator may be nine pixels wide (e.g., being centered on the display 420) by eleven pixels tall (e.g., extend in the entire height of the display 420).

The recording indicator 1128 is provided as a solid or blinking indicator. For example, a pixel in a corner of the display 420 (e.g., the upper left corner of the 11×11 grid) may blink on/off or between low and high brightness (e.g., at 60 Hz or 420 Hz).

The time indicator 1126 and the recording indicator 1128 may be different colors. For example, the time indicator 1126 may be white (e.g., provided by the lights 822 that are LEDs with a dedicated white color), while the recording indicator 1128 may be red (e.g., provided by the light 822 that is a LED with a dedicated red color a multi-color LED that outputs red when providing the recording indicator 1128).

Referring also to FIG. 11B, the display 420 may reconfigure according to the physical orientation of the camera 400. As shown, as the camera 400 is physically rotated, the orientation of the graphics on the display 420 rotate relative to the body 410 of the camera 400. For example, the camera 400 may be considered in a first orientation in FIG. 11A (e.g., a landscape orientation) with a short dimension of the body 410 arranged vertically. In the first orientation, an X-dimension of grid of the lights 822 of the display 420 is horizontal and a Y-dimension is vertical. In the first orientation, the display 420 displays the numerals of the time indicator 1126 vertically parallel with the short dimension of the body 410 (i.e., in the Y-dimension) and displays the recording indicator 1128 in an upper left corner thereof (i.e., minimum X-dimension and maximum Y-dimension). The time indicator 1126 spans the height of the display 420 (e.g., the entire Y-dimension, such as eleven pixels high) and spans a portion of the width of the display 420 (e.g., less than the entire X-dimension, such as less than 90% thereof, such as nine pixels wide) and may be centered along the X-dimension.

Referring to FIG. 8B, the camera 400 is in a second orientation (e.g., a portrait orientation) with the short dimension of the body 410 arranged horizontally. In the second orientation, the X-dimension of the display is instead vertical, and the Y-dimension is horizontal. In the second orientation, the display 420 displays the numerals of the time indicator 1126 vertically instead parallel with the long dimension of the body 410 (i.e., now in the X-dimension of the display 420) and displays the recording indicator 1128 in an upper left corner thereof (i.e., now the maximum X-dimension and the maximum Y-dimension). The time indicator 1126 spans the height of the display 420 (e.g., now the entire X-dimension, such as eleven pixels high) and spans a portion of the width of the display 420 (e.g., now less than the entire Y-dimension, such as less than 90% thereof, such as nine pixels wide) and may be centered along the Y-dimension. As the camera 400 is continued to be rotated into further orientations (e.g., upside down and another portrait orientation), the time indicator 1126 may reconfigure further, so as to occupy the same portions of the display 420 as in the first two orientations, respectively, but in opposite orientations).

The recording indicator 1128 remains in a fixed spatial relationship relative to the time indicator 1126 (e.g., upward and to the left) but changes position on the display 420 itself (e.g., being the minimum X-dimension and the maximum Y-dimension in the first orientation and the maximum X-dimension and the maximum Y-dimension in the second orientation). As the camera 400 is continued to be rotated into the further orientations (e.g., upside down and another portrait orientation), the recording indicator 1128 remains in the fixed orientation relative to the time indicator 1126 but occupies different portions of the display 420 (e.g., maximum X-dimension and minimum Y-dimension, and then minimum X-dimension and minimum Y-dimension). Regardless of the orientation of the camera 400, the time indicator 1126 may be configured to not occupy any portion of the display 420 that forms the recording indicator 1128 in any other orientation.

In one specific example, the lights 822 in the corners of the grid may be a different color (e.g., four dedicated red or multi-color LEDs) than the lights 822 therebetween may provide the time indicator (e.g., 117 dedicated white LEDs).

The camera 400 may determine when the orientation of the camera 400 is changed, for example, according to one of the sensors 648, which may be a gyroscope by which the orientation of the camera 400 may be determined, or according to a recording setting (e.g., landscape mode, portrait mode, an upside or suspended mode), which may be selected by a user (e.g., via a menu). The controller 652 causes the display 420 to display the graphics in the different orientations according to the orientation sensed with the gyroscope.

In other modes, the camera 400 may utilize the display 420 for displaying other indicators containing alphanumeric characters instead of the time indicator 1126 and/or for displaying another indicator instead of the recording indicator 1128. Thus, the time indicator 1126 may instead be referred to as an alphanumeric indicator, and the recording indicator 1128 may be instead be referred to as an on/off, blinking, pixel, or dot indicator (e.g., blinking dot indicator). For example, the display 420 may simultaneously display the alphanumeric characters and the dot indicator.

In another recording mode (e.g., stealth recording mode), the camera 400 may provide only the recording indicator 1128 (e.g., a single one of the lights 822, such as a red LED that blinks) and not the time indicator 1126. As a result, those of the lights 822 that might otherwise emit light for the time indicator 1126 may be off, so as to not distract a user and/or to not illuminate subjects being recorded by the camera. As an alternative to the display 420, a display may include fewer of the lights 822, such as consisting of one of the lights 822 (e.g., one red LED) constructed as described previously (e.g., shining through the outer layer 712b that is elastomeric), which may function as the recording indicator 1128.

Referring to FIGS. 12A-12D, in a still further recording mode (e.g., a fixed-duration recording mode), the camera 400 may provide a graphical timer 1222 that indicates time elapsed and/or time remaining of a fixed recording duration. The graphical timer 1222 is configured as a border that traces an outer periphery of the display 420 (e.g., those outer rows and columns of the lights 822 of the display 420). The entire border of the display 420 may represent the entire fixed duration of the current recording, which may be set by the user or predetermined for the user (e.g., 6, 15, 30, or 60 seconds, more, or less). For example, with an 11 by 11 grid of the lights 822, the border may be represented by those 40 of the lights 822 extending therearound, or a subset thereof (e.g., 36 of the lights 822 by omitting those of the lights 822 in the corners, as is shown). As time elapses, each adjacent one of the lights 822 subsequently illuminates. For example, a leading light 1222a of the lights is illuminated at a high brightness (as illustrated by being filled with black). Each trailing light 1222b, which was previously the leading light 1222a, may remain illuminated at the same or lower brightness (as shown and illustrated by being outlined). As a result, the illuminated portions of the border, which represent elapsed time, indicate that portion of the fixed recording duration that has been completed. Upon completion of the fixed recording duration, all or a subset of the lights 822 forming the border may be illuminated at high brightness to indicate completion of the recording (see FIG. 12D). As with the time indicator 1126, the graphical timer 1222 and/or the recording indicator 1128 may change orientation on the display 420 as the orientation of the camera 400 is changed.

Further, the recording indicator 1128 may be provided in conjunction with the graphical timer 1222. As noted previously, the light 822 of the recording indicator 1128 may be a different color (e.g., red) than other lights 822 of the display 420 (e.g., those forming the graphical timer 1222 being white). While the recording indicator 1128 was illustrated in FIGS. 11A-11B as being on at high brightness, the recording indicator 1128 may instead blink between low and high illuminance, as is illustrated in FIGS. 12A-12D, or between on and off.

Referring to FIGS. 13A-13B, in a charging mode, the camera 400 utilizes the display 420 for indicating whether the camera 400 is being charged (e.g., the battery thereof) and/or a state of charge of the camera 400. As is illustrated a charging indicator 1322 includes a first group of lights 1322a that indicates a level completed charge, a second group of lights 1322b (e.g., a single one of the lights 822) that indicates a level of charging being performed, and a third group of lights 1322c that indicates a level of uncompleted charge. The first group of lights 1322a are illuminated at a high brightness (indicated by being filled in black). As shown, five lights 822 represent the total level of charge, such that the single light 1322a indicates a 20% completed level of charge. As the total level of charge increases to different levels (e.g., 40%, 60%, 80%, 400%), the first group of lights 1322a increases to include those lights 822 previously of the second group of lights 1322b and the third group of lights 1322c. The second group of lights 1322b, as shown, is one of five lights, thus representing a 40% (e.g., 21% to 40%) level of charge is being performed. The second group of lights 1322b blinks, as is indicated between FIGS. 13A (outlined to show low brightness) and 10B (filled in black to show high brightness). The third group of lights 1322c are illuminated at a low brightness (indicated by being outlined), such that the uncompleted levels of charge (e.g., 41% to 400%) is illustrated to the user.

As is shown, the charging indicator 1322 utilizes lights 822 in a single column. The charging indicator 1322 may use a single color of the lights 822 (e.g., white). The charging indicator 1322 may not utilize those lights 822 in the corners of the display 420, which may be of a different color (e.g., red). Further, the charging indicator 1322 may utilize the lights 822 that are separated by one non-illuminated light therebetween, so as to provide visual granularity to the user. As is shown, the charging indicator 1322 utilizes five of eleven of the lights 822 in a single column (e.g., in a 11×11 grid of the lights 822).

While the charging indicator 1322 is provided, the remaining portions of the display 420 may be utilized to display other graphics (e.g., in the 10 other columns in the 11×11 grid of the lights 822).

In still further examples, the camera 400 may utilize the display 420 in other manners for displaying other graphics. For example, in a warning or fault mode, the display 420 may display a warning graphic, such as illuminating or blinking those of the lights 822 in the corners (e.g., four red lights in the corners of the display 420) or displaying an icon (e.g., an exclamation point), which may indicate presence of a fault or warning (e.g., temperature or low battery remaining). In a beacon mode, the display 420 may display a beacon (e.g., blinking some or all of the lights 822 at high or maximum brightness). For example, the beacon mode may be enabled upon receipt of a signal from a remote control device by which camera 400 may be controlled (e.g., a smartphone) or automatically upon detection of certain conditions. In a flash mode, the display 420 may simultaneously illuminate several (e.g., all) of the lights 822 at a high or maximum brightness, so as to illuminate a subject of a still photo captured by the camera 400. In a delayed capture mode, the display 420 may display a countdown timer (e.g., 10 seconds or 3 seconds) upon completion of which a still photo is captured by the camera 400. In a setting mode, the display 420 may display setting information, such as the image resolution (e.g., to be captured by the camera 400), frame rate, or field of view. When cycling through modes to be selected by the user, the display 420 may display iconography indicative of a corresponding mode.

In various other modes, the display 420 may display graphics according to the other sensors 648 of the camera 400. For example, in a voice command mode in which the camera 400 receives user instructions audibly, the display 420 display graphics that are animated in response to sound detected by a microphone of the sensors 648. For example, the display 420 may display an animated waveform that is visually changed according to sound detected by the microphone (e.g., volume). In a leveling mode, the display 420 displays graphics that indicates the orientation of the camera 400 relative to level in response to measurements from a gyroscope of the sensors 648 (mentioned previously). For example, the display 420 may display an animated graphic of a bubble level, an attitude indicator, or a turn indicator (e.g., indicating tilt about a longitudinal axis, such as the optical axis of the camera 400). In a self-portrait mode (e.g., a selfie mode), the display 420 displays graphics that indicate a condition of the user determined with image recognition (e.g., facial recognition) with the image sensor 642. For example, the graphic may be an animated face (e.g., an emoji) that animates eyes (e.g., to indicate blinking) and/or a mouth (e.g., to indicate smiling) of the user or subject of the portrait, or may move the animated face to illustrate the position of the face within the frame of the photo to be taken by the camera 400. Still further, in an automated portrait mode, the camera 400 may detect conditions of subjects (e.g., people) with the image sensor 642 (e.g., determining whether the subject(s) are smiling and/or blinking) and automatically take one or more pictures in response thereto. The display 420 may, accordingly, provide an indication that a picture has been taken (e.g., by blinking one or more of the lights 822 (e.g., the border), when the picture is taken. In the automated portrait mode, the display 420 may further display those animated graphics of the subject of the user (e.g., eyes and/or mouth) in the self-portrait mode.

The word "example" is used herein to mean serving as an example, instance, or illustration. An aspect or design described herein as "example" is not necessarily to be construed as being preferred or advantageous over other aspects or designs. Rather, use of the word "example" is intended to present concepts in a concrete fashion. As used in this application, the term "or" is intended to mean an inclusive "or" rather than an exclusive "or." That is, unless specified otherwise or clearly indicated otherwise by the context, the statement "X includes A or B" is intended to mean a natural inclusive permutation thereof. That is, if X includes A; X includes B; or X includes both A and B, then "X includes A or B" is satisfied under one or more of the foregoing instances. In addition, the articles "a" and "an" as used in this application and the appended claims should generally be construed to mean "one or more," unless specified otherwise or clearly indicated by the context to be directed to a singular form. Moreover, use of the term "an implementation" or the term "one implementation" throughout this disclosure is not intended to mean the same implementation unless described as such.

The above-described implementations and examples have been described in order to facilitate easy understanding of this disclosure and do not limit this disclosure. On the contrary, this disclosure is intended to cover various modifications and equivalent arrangements included within the scope of the appended claims, which scope is to be accorded the broadest interpretation as is permitted under the law so as to encompass all such modifications and equivalent arrangements.

What is claimed is:

1. A camera comprising:
   a body;
   a lens and an image sensor coupled to the body and cooperatively configured to capture images; and a display coupled to the body, substantially hidden from view when not illuminated, and configured to display graphics when illuminated;

wherein the body includes an outer layer comprising an elastomeric material through which light from the display passes to display the graphics and which substantially hides the display from view when not illuminated, and wherein the body includes an inner structure to which the outer layer is coupled, the inner structure including a grid of apertures through which the light from the display passes to display the graphics.

2. The camera according to claim 1, wherein the body hides the display from view when not illuminated and permits the light from the display to pass therethrough when illuminated to display the graphics.

3. The camera according to claim 1, wherein the display includes a grid of lights, and each light of the grid of lights is associated with one aperture of the grid of apertures.

4. The camera according to claim 3, further comprising a light diffuser that is arranged between the inner structure of the body and the grid of lights and that diffuses light emitted by the grid of lights before passing through the apertures associated therewith.

5. The camera according to claim 2, the body includes a first side to which the lens is coupled and on which the display displays the graphics.

6. The camera according to claim 5, further comprising a second display, wherein the second display is coupled to a second side of the body facing opposite the first side.

7. The camera according to claim 6, wherein the second display has substantially higher resolution and substantially higher pixel density than the display.

8. The camera according to claim 7, wherein the display has a first pixel density of 40 pixels per inch (PPI) or lower, and the second display has a second pixel density of 160 PPI or greater.

9. A camera comprising:
a lens and an image sensor cooperatively configured to capture images;
a display that is substantially hidden from view when not illuminated and that displays graphics when illuminated; and
a body having a first side to which the lens is coupled and on which the display displays the graphics,
wherein the display includes a grid of lights that are selectively illuminable to display the graphics; and
wherein the first side of the body includes an inner layer formed of a rigid plastic and an outer layer coupled to the inner layer and formed of an elastomeric material, the inner layer having a grid of apertures covered by the outer layer.

10. The camera according to claim 9, wherein the grid of lights consists of an 11×11 grid of LEDs of which the LEDs in each of four corners of the 11×11 grid emit a first color and a remainder of the LEDs of the 11×11 grid of LEDs emit a second color that is different from the first color.

11. The camera according to claim 9, wherein the grid of lights is a grid of light-emitting diodes (LEDs), and at least 90% of the LEDs of the grid of LEDs emit a common dedicated color, and less than 10% of the LEDs of the grid of LEDs emit one or more other colors that are different from the common dedicated color.

12. The camera according to claim 9, wherein the display displays alphanumeric characters that span a first dimension but not a second dimension of the display in a first orientation of the camera and that span the second dimension but not the first dimension of the display in a second orientation of the camera.

13. The camera according to claim 12, wherein the display displays a dot indicator simultaneously with the alphanumeric characters, and a spatial relationship between the alphanumeric characters and the dot indicator does not change between the first orientation and the second orientation of the camera.

14. The camera according to claim 9, wherein the display is a first display, further comprising:
a second display on a second side of the body and facing opposite the first side of the body, wherein the second display is a display panel having a second pixel density of 160 PPI or greater,
wherein the grid of lights are contained within the body and selectively emit light through the grid of apertures and the elastomeric material,
wherein the first display has a first pixel density of 40 pixels per inch (PPI) or lower and a first display area that is less than a second display area of the second display, and
wherein the grid of lights is hidden from view by the elastomeric material when not emitting light.

15. A camera comprising:
a body having a first side and a second side facing opposite the first side, wherein the first side of the body includes an inner layer formed of a rigid plastic and an outer layer coupled to the inner layer and formed of a light-permeable material, the inner layer having apertures covered by the outer layer;
a lens coupled to the first side of the body and an image sensor contained within the body, wherein the lens and the image sensor are cooperatively configured to capture images;
a first display on the first side of the body, wherein the first display includes lights that are contained within the body and selectively emit light through the apertures and the light-permeable material, the first display having a first pixel density at or below 40 pixels per inch (PPI);
a light diffuser that is arranged between the inner layer of the body and the lights of the first display, wherein the light diffuser is configured to diffuse light emitted by the lights before passing through the outer layer; and
a second display on the second side of the body and facing opposite the first display, wherein the second display is a display panel having a second pixel density at or above 160 PPI,
wherein the lights are hidden from view by the light-permeable material when not emitting light.

16. The camera according to claim 15, wherein the apertures in the inner layer consist of a grid of apertures, wherein the lights of the first display consist of a grid of LEDs, and wherein the LEDs in each of four corners of the grid of LEDs emit a first color and a remainder of the LEDs of the grid of LEDs emit a second color that is different from the first color.

17. The camera according to claim 15, wherein the first display is configured to display alphanumeric characters that span a first dimension but not a second dimension of the first display in a first orientation of the camera and that span the second dimension but not the first dimension of the first display in a second orientation of the camera.

18. The camera according to claim 1, wherein the elastomeric material is rubber.

19. The camera according to claim 9, wherein the inner layer is a separate piece from the display and the display is a grid of lights.

\* \* \* \* \*